United States Patent
Weber et al.

(10) Patent No.: US 11,929,395 B2
(45) Date of Patent: Mar. 12, 2024

(54) SUPERJUNCTION TRANSISTOR DEVICE

(71) Applicant: Infineon Technologies Austria AG, Villach (AT)

(72) Inventors: Hans Weber, Bayerisch Gmain (DE); Ingo Muri, Villach (AT); Maximilian Treiber, Munich (DE); Daniel Tutuc, St. Niklas an der Drau (AT)

(73) Assignee: Infineon Technologies Austria AG, Villach (AT)

( * ) Notice: Subject to any disclaimer, the term of this patent is extended or adjusted under 35 U.S.C. 154(b) by 245 days.

(21) Appl. No.: 17/513,344

(22) Filed: Oct. 28, 2021

(65) Prior Publication Data

US 2022/0052154 A1 Feb. 17, 2022

Related U.S. Application Data

(62) Division of application No. 16/715,816, filed on Dec. 16, 2019, now Pat. No. 11,189,690.

(30) Foreign Application Priority Data

Dec. 17, 2018 (DE) .......................... 102018132435.9

(51) Int. Cl.
*H01L 29/06* (2006.01)
*H01L 21/265* (2006.01)
*H01L 29/66* (2006.01)
*H01L 29/78* (2006.01)

(52) U.S. Cl.
CPC .... *H01L 29/0634* (2013.01); *H01L 21/26586* (2013.01); *H01L 29/66712* (2013.01); *H01L 29/7802* (2013.01); *H01L 29/7811* (2013.01); *H01L 29/0623* (2013.01)

(58) Field of Classification Search
CPC ..... H01L 21/26586; H01L 29/06–1095; H01L 29/66674–66734; H01L 29/7801–7826
See application file for complete search history.

(56) References Cited

U.S. PATENT DOCUMENTS

| | | | |
|---|---|---|---|
| 6,040,600 A | 3/2000 | Uenishi et al. | |
| 8,673,700 B2 * | 3/2014 | Yedinak | H01L 29/0634 257/302 |
| 8,753,937 B2 | 6/2014 | Lin et al. | |

(Continued)

FOREIGN PATENT DOCUMENTS

| | | |
|---|---|---|
| DE | 10100802 C1 | 8/2002 |
| DE | 102007026745 A1 | 12/2008 |
| DE | 102016112970 B3 | 8/2017 |

*Primary Examiner* — Andres Munoz
(74) *Attorney, Agent, or Firm* — Murphy, Bilak & Homiller, PLLC

(57) ABSTRACT

A method and a transistor device are disclosed. The transistor device includes: a semiconductor body; first regions of a first doping type and second regions of a second doping type in an inner region and an edge region of the semiconductor body; transistor cells in the inner region of the semiconductor body, each transistor cell including a body region and a source region, the transistor cells including a common drain region; and a buffer region arranged between the drain region and the first and second regions. A dopant dose in the first and second regions decreases towards an edge surface of the semiconductor body. A dopant dose in the buffer region decreases towards the edge surface.

17 Claims, 16 Drawing Sheets

(56) References Cited

U.S. PATENT DOCUMENTS

| | | |
|---|---|---|
| 9,093,474 B2 | 7/2015 | Saito et al. |
| 2003/0132450 A1 | 7/2003 | Minato et al. |
| 2003/0222327 A1* | 12/2003 | Yamaguchi ......... H01L 29/0634 |
| | | 257/500 |
| 2007/0272979 A1 | 11/2007 | Saito et al. |
| 2012/0098064 A1* | 4/2012 | Onishi ................ H01L 29/0619 |
| | | 257/341 |
| 2014/0197477 A1 | 7/2014 | Onishi |
| 2014/0217496 A1 | 8/2014 | Kachi |
| 2017/0117354 A1 | 4/2017 | Chen et al. |
| 2017/0200784 A1 | 7/2017 | Shirakawa et al. |
| 2018/0019132 A1 | 1/2018 | Mauder et al. |
| 2019/0058038 A1 | 2/2019 | Weber et al. |
| 2019/0148484 A1* | 5/2019 | Kowalik-Seidl .... H01L 29/0634 |
| | | 257/329 |
| 2020/0176559 A1 | 6/2020 | Weber |

* cited by examiner

SUPERJUNCTION TRANSISTOR DEVICE

TECHNICAL FIELD

This disclosure relates in general to a method for forming a superjunction transistor device, in particular a vertical superjunction transistor device.

BACKGROUND

A vertical superjunction transistor device includes a plurality of transistor cells. Each of the transistor cells includes a source region, a body region, a drift region, a compensation region, and a drain region in an inner region of the semiconductor body. The source and drift regions have a first doping type, and the body and compensation regions have a second doping type complementary to the first doping type. Further, a gate electrode is adjacent each body region and dielectrically insulated from the body region by a gate dielectric. The source region and the drain region of each cell are spaced apart from each other in a vertical direction of the semiconductor body, wherein the drain regions of the plurality of transistor cells may be formed by one contiguous semiconductor layer. A vertical superjunction transistor device may further include drift and compensation regions in an edge region of the semiconductor body, wherein the edge region surrounds the inner region and is free of body and source regions.

The transistor device can be operated in an on-state and an off-state. In the on-state, a drive voltage (gate-source voltage) is applied between the gate electrode and the source region such that there is a conducting channel in the body regions between the source regions and the drift regions. In the on-state, a current can flow between the drain region and the source regions when a voltage is applied between the drain region and the source regions. In the off-state, the gate electrode is driven such that the conducting channel in the body regions is interrupted. In this operating state, when a voltage is applied between the drain region and the source regions that reverse biases pn-junctions between the body regions or compensation regions and the drift regions, depletion regions (space charge regions) expand in the drift and compensation region. These depletion regions are associated with an electric field. An Avalanche breakdown may occur when the voltage applied between the drain region and the source regions is such that a magnitude of the electric field reaches a critical value.

In many cases it is desirable to design a superjunction transistor device such that a voltage blocking capability in the inner region is lower than in the edge region so that an Avalanche breakdown, if there is one, occurs in the inner region, which has a greater area (and volume) than the edge region.

There is therefore a need for producing a superjunction transistor device such that a voltage blocking capability in the edge region is higher than in the inner region.

SUMMARY

One example relates to a method. The method includes forming a plurality of first regions of a first doping type and a plurality of second regions of a second doping type in an inner region and an edge region of a semiconductor body, and forming body regions and source regions of a plurality of transistor cells in the inner region of the semiconductor body. Forming the first regions and the second regions includes forming a plurality of semiconductor layers one on top of the other, and, in each of the plurality of semiconductor layers, before forming a respective next one of the plurality of semiconductor layers, forming a plurality of trenches in the inner region and the edge region and implanting dopant atoms into a first sidewall and a second sidewall of each of the plurality of trenches. Implanting the dopant atoms into at least one of the plurality of semiconductor layers includes partly covering the trenches in the edge region during an implantation process.

Another example relates to a transistor device. The transistor device includes a semiconductor body; a plurality of first regions of a first doping type and a plurality of second regions of a second doping type in an inner region and an edge region of the semiconductor body; a plurality of transistor cells in the inner region of the semiconductor body, wherein each transistor cell comprises a body region and a source region and wherein the transistor cells comprise a common drain region; and a buffer region arranged between the drain region and the first and second regions. A dopant dose in the first and second regions decreases towards an edge surface of the semiconductor body, and a dopant dose in the buffer region decreases towards the edge surface.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
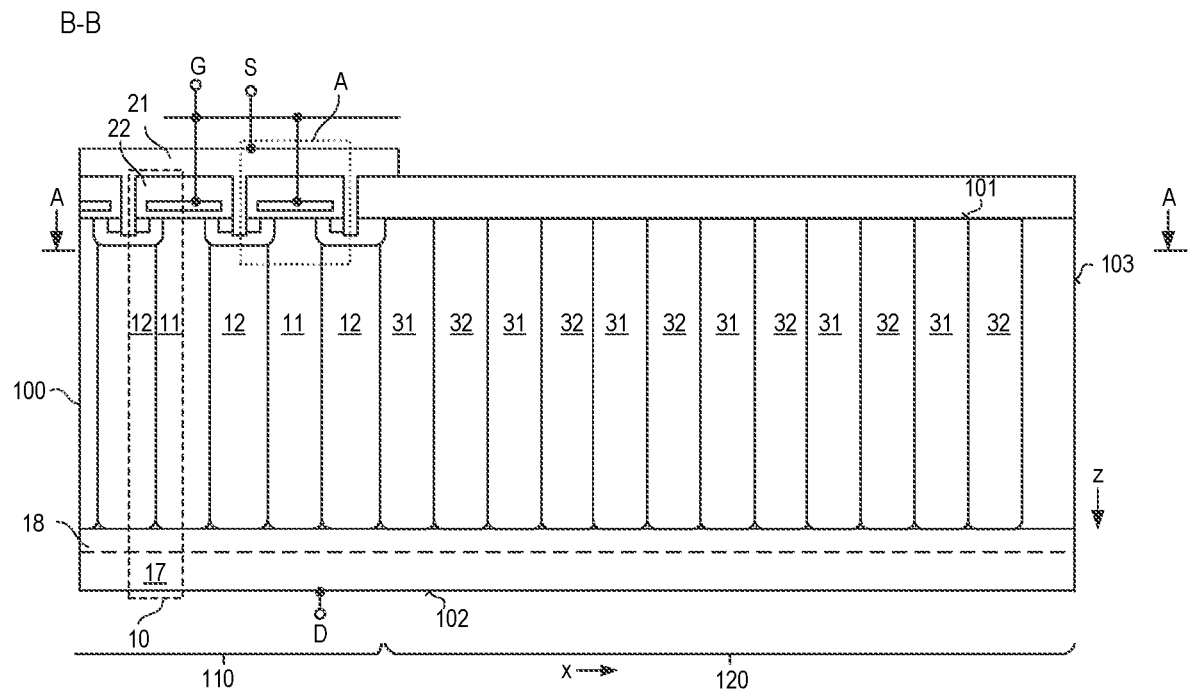
FIGS. 1A and 1B schematically illustrates a vertical cross sectional view of a vertical superjunction transistor device.
Figure 1B:
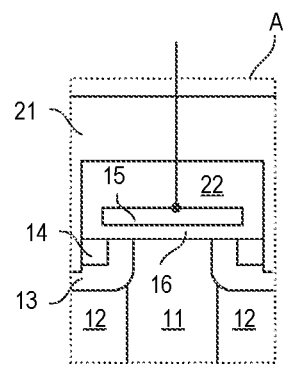

FIG. 1A schematically illustrates a vertical cross sectional view of one example of a superjunction transistor device, and FIG. 1B illustrates a section "A" of this transistor device in greater detail. The transistor device includes a semiconductor body 100 with a first surface 101, a second surface 102 opposite the first surface 101, and an edge surface 103 extending from the first surface 101 to the second surface 102. The second surface 102 is spaced apart in a vertical direction z of the semiconductor body 100 from the first surface 101. The "vertical direction z" is a direction perpendicular to the first and second surfaces 101, 102. According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like.

The semiconductor body 100 includes an inner region 110 and an edge region 120. The edge region 120 is arranged between the edge surface 103 and the inner region 110 and, in a horizontal plane, surrounds the inner region 110. The "horizontal plane" is a plane parallel to the first and second surface 101, 102.

Referring to FIGS. 1A and 1B, the transistor device includes a plurality of transistor cells 10, wherein each of these transistor cells 10 includes active device regions in the inner region 110 of the semiconductor body 100. The active device regions of each transistor cell 10 include a first region 11 of a first doping type and a second region 12 of a second doping type complementary to the first doping type. The first regions 11 in the inner region 110 are also referred to as drift regions in the following, and second regions 12 in the inner region 110 are also referred to as compensation regions in the following. Further, as illustrated in FIG. 1B, the active device regions of each transistor cell 10 include a body region 13 of the second doping type and a source region 14 of the first doping type, wherein the body region 13 is arranged between the source region 14 and the drift region 11 so that the source region 14 is separated from the drift region 11 by the body region 13. The compensation region 12 adjoins the body region 13, according to one example.

Further, referring to FIG. 1B, the active device regions of each transistor cell 10 include a drain region 17. The drain region 17 may adjoin each of the drift region 11 and the compensation region 12. Optionally, as illustrated in dashed lines in FIGS. 1A and 1B, a buffer region 18 of the first doping type may be arranged between the drain region 17 and each of the drift region 11 and the compensation region 12.

According to one example, the semiconductor body 100 includes monocrystalline silicon and the individual active device regions are implemented such that a respective doping concentration is in a range as outlined in the following: drift region 11: between $1E15$ $cm^{-3}$ and $1E17$ $cm^{-3}$; compensation region 12: between $1E15$ $cm^{-3}$ and $1E17$ $cm^{-3}$; body region 13: between $1E17$ $cm^{-3}$ and $1E18$ $cm^{-3}$; source region 14: between $1E18$ $cm^{-3}$ and $1E21$ $cm^{-3}$; drain region 17: between $1E18$ $cm^3$ and $1E21$ $cm^{-3}$; optional buffer region 18: between $1E15$ $cm^{-3}$ and $1E17$ $cm^3$.

Referring to FIGS. 1A and 1B, the drain regions 17 of each of the plurality of transistor cells 10 can be formed by one contiguous semiconductor region, which is referred to as drain region of the transistor device in the following. Further, the drift regions 11 of two neighboring transistor cells 10 can be formed by one contiguous semiconductor region of the first doping type, and the compensation regions 12 of two (other) transistor cells 10 can be formed by a contiguous semiconductor region of the second doping type.

Referring to FIGS. 1A and 1B, each transistor cell further includes a gate electrode 15 that is arranged adjacent the body region 13 and that is dielectrically insulated from the body region 13 by a gate dielectric 16. The gate electrode 15 serves to control a conducting channel in the body region 13 between the source region 14 and the drift region 11. The gate electrodes 15 of the individual transistor cells are connected to a gate node G. The gate node G as well as connections between the gate electrodes 15 and the gate node G are only schematically illustrated in FIGS. 1A and 1B. Further, the source and body regions 14, 15 of the individual transistor cells 10 are connected to a source electrode 21 that is electrically insulated from the gate electrodes 15 by an insulation layer 22. The source electrode 21 is connected to a source node S or forms a source node S of the transistor device. Further, the drain region 17 is connected to a drain node D of the transistor device. The transistor device can be an n-type transistor device or a p-type transistor device. In an n-type transistor device, the source regions 14 and the drift regions 11 are n-type semiconductor regions and the body regions 13 and the compensation regions 12 are p-type semiconductor regions. In a p-type transistor device the doping types of the individual active device regions are complementary to the doping type of corresponding device regions in an n-type transistor device. Further, the transistor device can be implemented as a MOSFET (Metal Oxide Semiconductor Field-Effect Transistor). In this case, the drain region 17 has the same doping type as the source region 14. According to another example, the transistor device is implemented as an IGBT (Insulated Gate Bipolar Transistor). In this case, the drain region 17 has a doping type complementary to the doping type of the source region 14.

The transistor device can be operated in an on-state or an off-state. In the on-state, the gate electrodes 15, by applying a suitable voltage (gate-source voltage) between the gate node G and the source node S, are driven such that there is a conducting channel in the body region 13 between the source region 14 and the drift region 11, so that a current can flow between the drain node D and the source node S when a voltage (drain-source voltage) higher than zero is applied between these circuit nodes D, S. In the off-state, the gate electrodes 15 are driven such that the conducting channel in the body regions 13 between the source regions 14 and the drift regions 11 are interrupted. In the off-state, when applying a voltage between the drain node D and the source node S that reverse biases pn-junctions between the drift regions 11 on one side and the body regions 13 and compensations regions 12 on the other side space charge regions (depletion regions) expand in the semiconductor body 100. In this operating state, a current flow through the transistor device is prevented.

Referring to FIG. 1A, the transistor device further includes a plurality of first regions 31 of the first doping type and a plurality of second regions 32 of the second doping type in the edge region 120 of the semiconductor body 100. Throughout the description, reference numbers 11 and 31 denote first regions, which are regions of the first doping type, wherein reference number 11 denotes those sections of the first regions that are arranged in the inner region 110 of the semiconductor body 100, and reference number 31 denotes those sections of the first regions that are arranged in the edge region 120 of the semiconductor body 100. Equivalently, reference numbers 12 and 32 denote second regions, which are regions of the second doping type, wherein reference number 12 denotes sections of the second regions that are arranged in the inner region 110, and reference number 32 denotes sections of the second regions that are arranged in the edge region 120 of the semiconductor body 100.

In the inner region 110, each of the first and second regions 11, 12 adjoins at least one body region 13. In the edge region 120, the majority of the first and second regions 31, 32 do not adjoin a body region. More specifically, at most an innermost one of the first and second regions 31, 32 located in the edge region 120 adjoins a body region of a transistor cell.

Figure 2A:
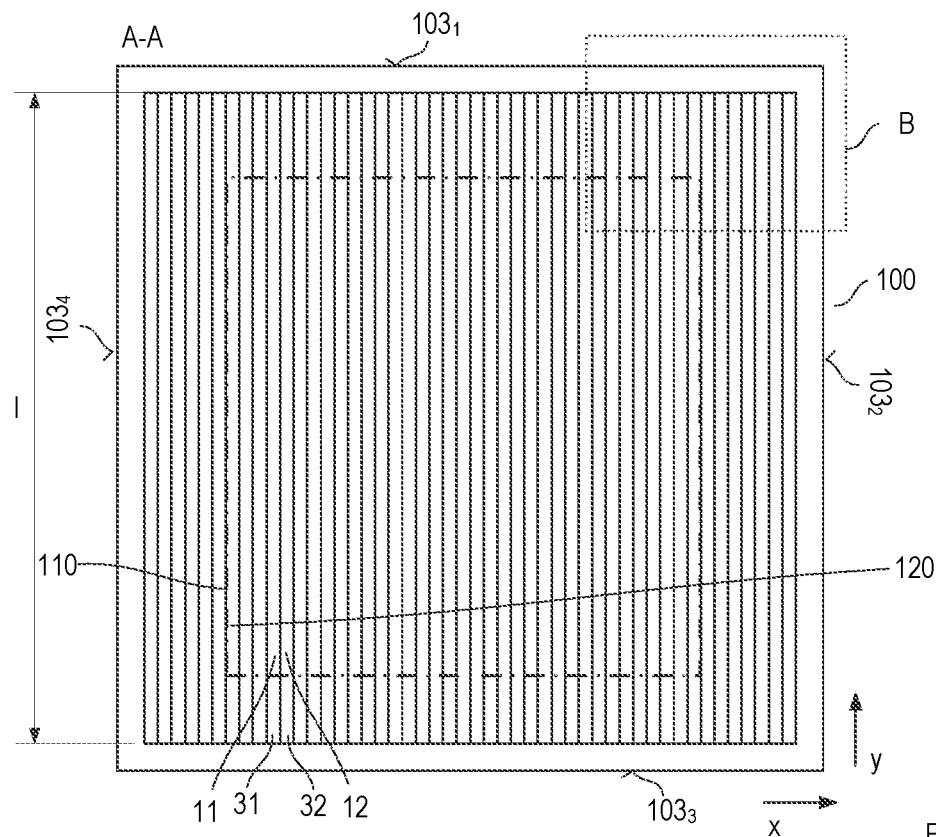
FIGS. 2A and 2B schematically illustrates a horizontal cross sectional view of a transistor device of the type shown in FIGS. 1A and 1B.
Figure 2B:
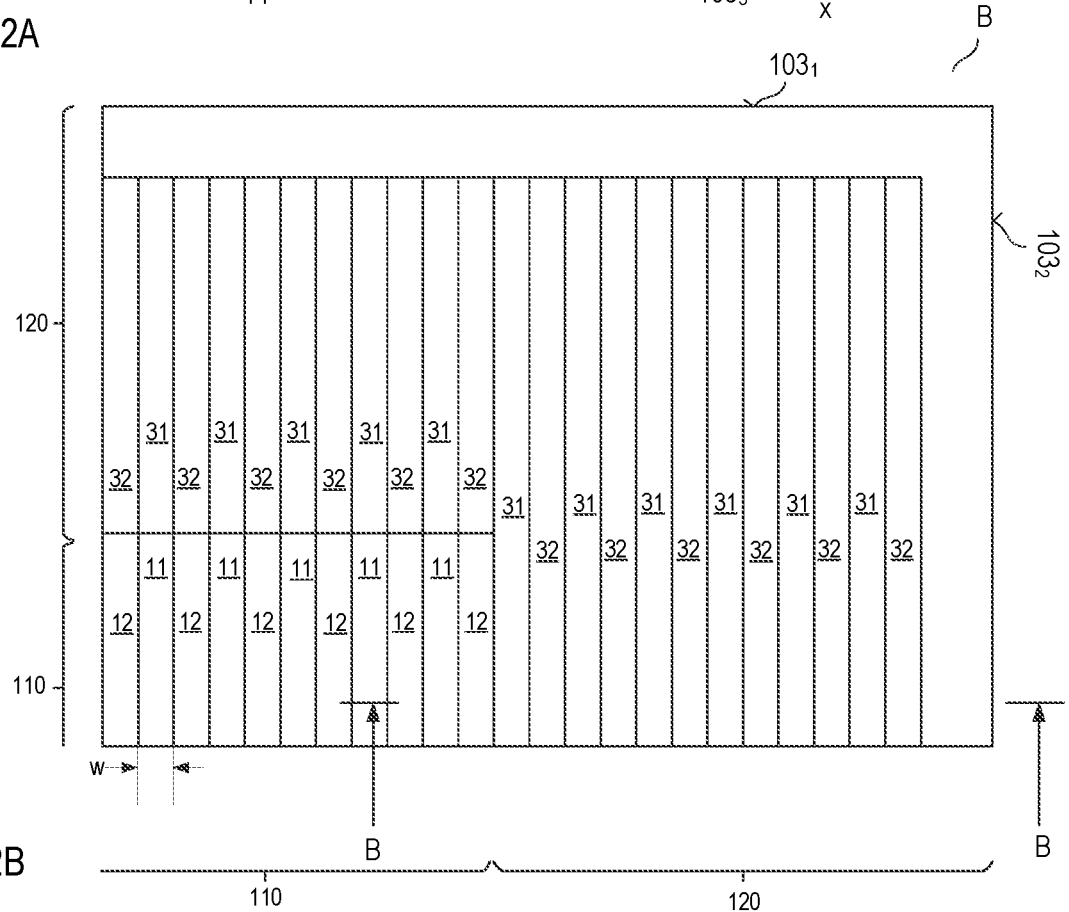

FIG. 2A schematically illustrates a horizontal cross sectional view of the semiconductor body 100 in a horizontal section plane A-A illustrated in FIG. 1A. FIG. 2B, illustrates a section "B" shown in FIG. 2A in greater detail.

Referring to FIG. 2A, the semiconductor body 100 may be rectangular in the horizontal plane A-A so that the edge surface 103 has four edge surface sections, $103_1$, $103_2$, $103_3$, $103_4$. Referring to FIG. 2A, the first regions 11, 31 and the second regions 12, 32 may be arranged alternatingly in a first horizontal (lateral direction) x of the semiconductor body 100 and may be elongated in a second horizontal direction y perpendicular to the first horizontal direction x. In the example illustrated in FIG. 2A, the first and third edge surface sections $103_1$, $103_3$ are essentially parallel to the first horizontal direction x, and the second and fourth edge surface sections $103_2$, $103_4$ are essentially parallel to the second lateral direction y. In this case, the first regions 11, 31 and the second regions 12, 32 are essentially perpendicular to the first and third edge surface sections $103_1$, $103_3$ and essentially parallel to the second and fourth edge surface sections $103_2$, $103_4$. "Elongated" means that a length l of the first and second regions 11, 31, 12, 32 is significantly greater than a width w of the first and second regions 11, 31, 12, 32. The length l is the dimension of the first and second regions 11, 31, 12, 32 in the second horizontal direction y, and the width w is the dimension of the first and second semiconductor regions 11, 31, 12, 32 in the first horizontal direction x. According to one example, a ratio l/w between the length l and the width w is at least 100, at least 1000, or at least 10000. Referring to FIGS. 2A and 2B, some of the first regions are entirely arranged in the edge region 120 and some of the second regions are entirely arranged in the edge region 120, while others of the first regions have sections 11 in the inner regions and other sections 31 in the edge region. Equivalently, others of the second regions have sections 12 in the inner region 110 and other sections 32 in the edge region 120.

In order to achieve a high avalanche robustness of the transistor device it is desirable to implement the first and second regions such that first regions 31 located in the edge region 120 are more lowly doped than first regions 11 located in the inner region and second regions 32 arranged in the edge region 120 are more lowly doped than second regions 12 arranged in the inner region 110. "More lowly doped" means that the overall number of dopant atoms in a section of the first regions 31 in the edge region 120 is lower than the overall number of dopant atoms in a section of a corresponding size of the first regions 11 in the inner region 110, and that the overall number of dopant atoms in a section of the second regions 32 in the edge region 120 is lower than the overall number of dopant atoms in a section of a corresponding size of the second regions 12 in the inner region 110. Examples of a method for implementing the first regions 11, 31 and the second regions 12, 32 in this way are explained in the following.

Figure 3:
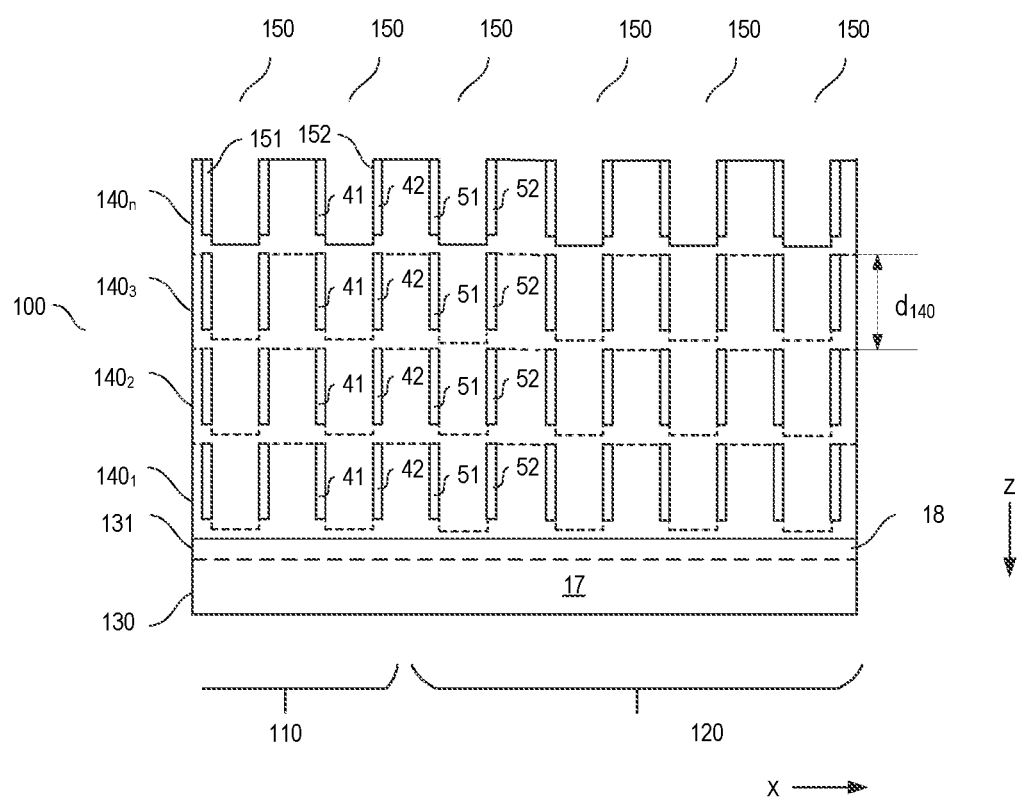
FIG. 3 illustrates a vertical cross sectional view of a plurality of semiconductor layers after forming trenches in each of the semiconductor layers and implanting dopant atoms into sidewalls of the trenches.

FIG. 3 illustrates one example of a method for forming the first and second regions 11, 31, 12, 32 after several process steps. More specifically, FIGS. 1A and 1B illustrate the semiconductor body 100 after several process steps of forming the first and second regions 11, 31, 12, 32. Referring to FIG. 3, the method includes forming a plurality of semiconductor layers $140_1$-$140_n$ one on top of the other, forming a plurality of trenches 150 in each of the plurality of semiconductor layers $140_1$-$140_n$, and implanting dopant atoms into opposite first and second sidewalls 151, 152 of each of the plurality of trenches 150. First implanted regions 41, 51 are formed by implanting the dopant atoms into the first sidewalls 151, and second implanted regions 42, 52 are formed by implanting the dopant atoms into the second sidewalls 152. First implanted regions and second implanted regions formed in trenches 150 in the edge region 120 are different from first implanted regions and second implanted regions formed in trenches 150 in the inner region 110, so that different reference numbers are used in FIG. 3 to denote first implanted regions in the inner region 110 and the edge region 120 and to denote second implanted regions in the inner region 110 and the edge region 120. Reference numbers 41, 51 denote first implanted regions in the inner region 110 and the edge region 120, respectively, and reference numbers 42, 52 denote second implanted regions in the inner region 110 and the edge region 120, respectively. The first and second regions 11, 31, 12, 32 explained before are formed based on these first and second implanted regions 41, 42, 51, 52 in a thermal process. This is explained in detail herein further below.

According to one example, forming each of the plurality of semiconductor layers $140_1$-$140_n$ includes an epitaxial growth process so that each of the semiconductor layers $140_1$-$140_n$ is a monocrystalline epitaxial layer. Referring to FIG. 3, a first one or lowermost one $140_1$ of the plurality of semiconductor layers $140_1$-$140_n$ is grown on a carrier 130. According to one example, the carrier 130 is a monocrystalline semiconductor substrate that forms the drain region 17 of the finished semiconductor device.

Optionally, the carrier includes a first section that forms the drain region 17 in the finished device and a second section that is arranged between the first section and the lowermost semiconductor layer $140_1$ and forms a buffer region 18. The first section may be formed by a semiconductor substrate 130 and the second section may be formed by an epitaxial layer 131 grown on the substrate 130. According to one example, the buffer region 18 has a lower doping concentration than the drain region. A doping of the buffer region 18 may be formed in various ways. According to one example, forming the buffer region 18 includes in-situ doping the epitaxial layer 131 in the epitaxial growth process. According to another example, forming the buffer region 18 includes growing an intrinsic epitaxial layer 131 and blanket implanting dopant atoms into the epitaxial layer 131. Another example of a method for forming the buffer layer is explained herein further below.

The semiconductor body 100 with the substrate 130, the optional epitaxial layer 131, and the plurality of semiconductor layers $140_1$-$140_n$ is a monocrystalline semiconductor layer. Thus, in the semiconductor body 100, there are no visible borders between the individual semiconductor layers $140_1$-$140_n$. However, for illustration purposes borders between the individual semiconductor layers $140_1$-$140_n$ are illustrated in dashed lines in FIG. 3.

Further, forming the plurality of semiconductor layers $140_1$-$140_n$ one on top of the other and on top of the substrate 130 may take place on a wafer level. That is, a plurality of semiconductor bodies 100 can be processed at once by being part of a wafer that includes a plurality of semiconductor bodies 100, wherein the wafer is divided at a later stage of the manufacturing process in order to form a plurality of semiconductor bodies 100. Edge surfaces 103 of the individual semiconductor bodies 100 are formed by dividing the wafer into the individual semiconductor bodies 100. Thus, at the manufacturing stage illustrated in FIG. 3, the edge surface 103 has not necessarily been formed yet. In this case, the lines labelled with reference characters 103, $103_1$, $103_2$, $103_3$, $103_4$ illustrates where the edge surface and its sections will be relative to the first and second regions 11, 12, 31, 32 after forming the plurality of semiconductor bodies 100 from one wafer.

In the example illustrated in FIG. 3, the lowermost semiconductor layer $140_1$ has been formed on the carrier 130, 131 and the other semiconductor layers $140_2$-$140_n$ have been formed on top of a respective other one of the semiconductor layers $140_1$-$140_n$. That is, a second semiconductor layer $140_2$ has been formed on the first semiconductor layer $140_1$, a third semiconductor layer $140_3$ has been formed on the second semiconductor layer $140_2$, and so on. In the following, $140_i$ denotes an arbitrary one of the plurality of semiconductor layers $140_1$-$140_n$. Forming one semiconductor layer $140_i$ on top of another semiconductor layer $140_{i-1}$ includes forming the semiconductor layer $140_i$ on top of a surface $141_{i-1}$ of the previous semiconductor layer and in the trenches of the previous semiconductor layer $140_{i-1}$.

FIG. 3 illustrates the semiconductor body 100 after forming each of the plurality of semiconductor layers $140_1$-$140_n$ so that the first trenches 150 in the semiconductor layers $140_1$-$140_{n-1}$ have been filled while the first trenches 150 in an uppermost one $140_n$ of the semiconductor layers $140_1$-$140_n$ are still open. Just for the purpose of illustration, the plurality of semiconductor layers $140_1$-$140_n$ includes n=4 semiconductor layers. This, however, is only an example. According to one example, the number n of semiconductor layers is selected from between 2 and 20, in particular from between 3 and 15. According to one example, the semiconductor layers $140_1$-$140_n$ are formed such that their respective thickness $d_{140}$ is between 2 micrometers and 12 micrometers. The thickness $d_{140}$ of one layer $140_i$ is the dimension of the semiconductor layer $140_i$ outside the trenches 150 and in the vertical direction z.

According to one example, the trenches 150 are elongated trenches. That is, a length, which is a dimension of these trenches 150 in a direction perpendicular to the section plane illustrated in FIG. 3, is much greater than a width, which is a dimension of these trenches 150 in the first horizontal direction x. According to one example, a ratio between the length and the width is at least 100, at least 1000, or at least 10000. According to one example, as illustrated in FIG. 3, the trenches 150 formed in the individual semiconductor layers $140_1$-$140_n$ are aligned in the vertical direction z.

In the example illustrated in FIG. 3, the trenches 150 have been formed such that each of these trenches 150 is formed inside only one semiconductor layer. That is, each of the trenches 150 formed in a semiconductor layer $140_i$ (wherein $140_i$ denotes an arbitrary one of the semiconductor layers $140_1$-$140_n$) does not extend into a semiconductor layer $140_{i-1}$ that has been directly formed before the semiconductor layer $140_i$. This, however, is only an example. According to another example (not illustrated) the trenches 150 formed in one semiconductor layer $140_i$ may extend into the semiconductor layer $140_{i-1}$ formed before.

Figure 4A:
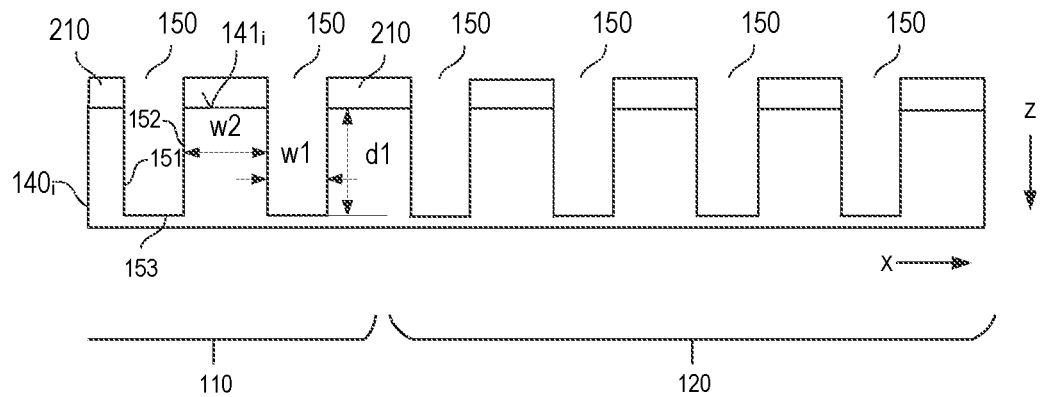
FIGS. 4A to 4C illustrates one example of a method for forming trenches in one semiconductor layer and implanting dopant atoms into sidewalls of the trenches, wherein the method includes partly covering trenches in the edge region during an implantation process by a protection layer.
Figure 4B:
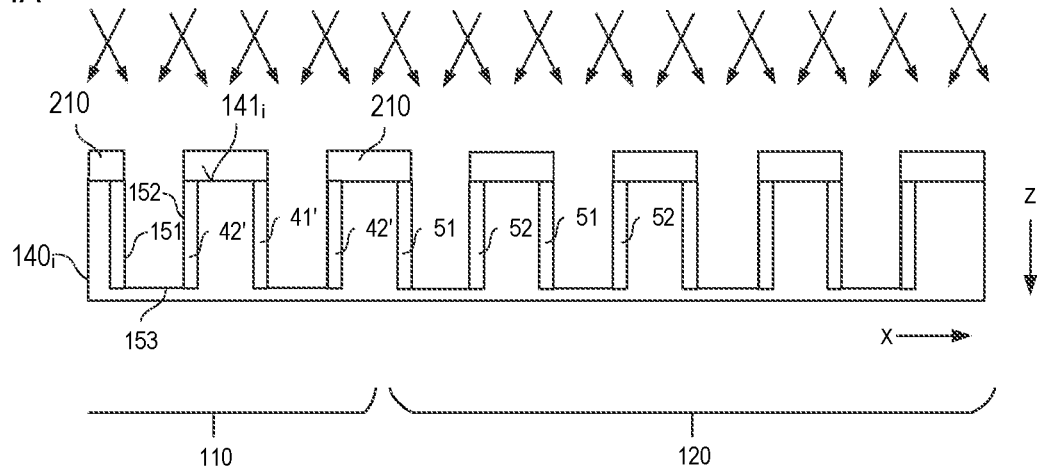
Figure 4C:
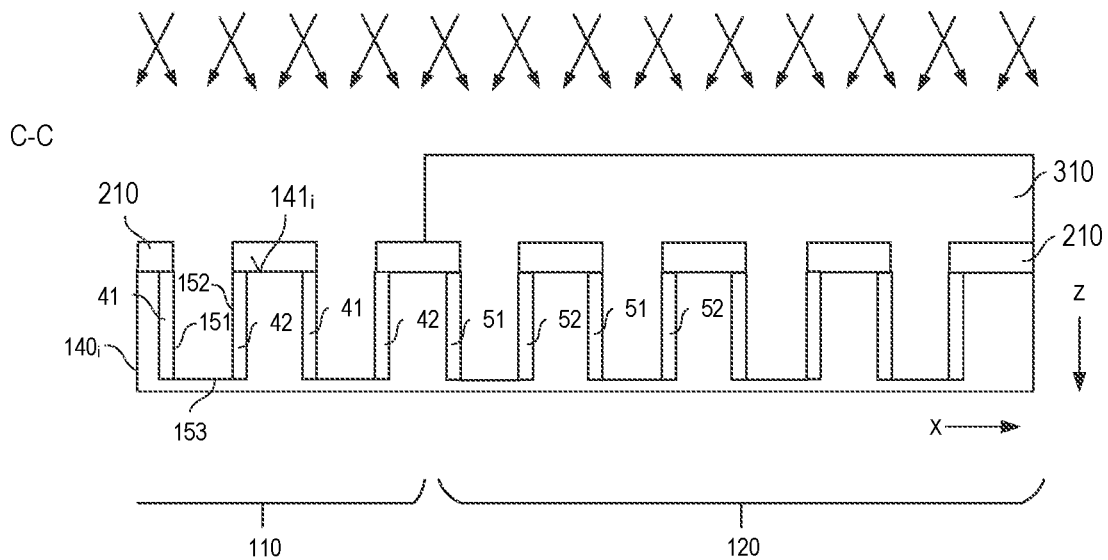

FIGS. 4A to 4C illustrate one example of a method for forming the trenches 150 and the first implanted regions 41, 51 and the second implanted regions 42, 52 in one semiconductor layer $140_i$. Each of FIGS. 4A to 4C illustrates a vertical cross sectional view of the semiconductor layer $140_i$ during different process steps, wherein only the semiconductor layer $140_i$ is illustrated in these figures.

Referring to FIG. 4A, the method includes forming a patterned etch mask 210 on top of the surface $141_i$ of the semiconductor layer $140_i$. The etch mask 210 is patterned such that it includes openings at those positions of the surface $141_i$ where the trenches 150 are to be formed. Patterning the etch mask 210 may include a lithographic process. Referring to FIG. 4A, the method further includes etching the first trenches 150 using the etch mask 210. Etching the first trenches 150 includes an anisotropic etching process, for example.

According to one example, the trenches 150 are formed such that an aspect ratio, which is a ratio between a depth d2 and a width w2 of the trenches 150, is between 1:1 and 5:1, in particular, between 1:1 and 3:1. The "depth d2" of the first trenches 150 is the dimension in the vertical direction z, and the "width w2" of the first trenches 150 is their dimension in the first lateral direction x. A distance w3 between neighboring trenches is between 0.6 times the width w2 and 1.4 times the width w2 of the first trenches 150. A region between two neighboring trenches 150 can be referred to as mesa region, so that the distance between neighboring trenches can also be referred to as width of mesa regions formed between the trenches 150.

Referring to FIGS. 4B and 4C, the method includes forming the first implanted regions 41, 51 along the first sidewalls 151 and the second implanted regions 42, 52 along the second sidewalls 152. In the example illustrated in FIGS. 4B and 4C, forming these implanted regions includes a first implantation process and a second implantation process illustrated in FIG. 4B and a third implantation process and a fourth implantation process illustrated in FIG. 4C. Before the third and fourth implantation process, a protection layer 310 is formed at least on the first and second sidewalls 151, 152 of trenches 150 or trench sections in the edge region 120 in order to prevent dopant atoms from being implanted into the first and second sidewalls 151, 152 of those trenches 150 or trench sections in the edge region 120 during the third and fourth implantation processes. "Trenches in the edge region" are trenches 150 entirely located in the edge region 120, and "trench sections in the edge region" are sections of trenches that are located in the edge, wherein the same trenches have other sections located in the inner region 110. In the first implantation process, dopant atoms are implanted into the first sidewalls 151 of trenches and trench sections 150 in the inner region 110 and the edge region 120; in the second implantation process, dopant atoms are implanted into the second sidewalls 152 of trenches and trench sections 150 in the inner region 110 and the edge region 120; in the third implantation process, dopant atoms are implanted into the first sidewalls 151 of trenches and trench sections 150 not covered by the protection layer 310; and in the fourth implantation process dopant atoms are implanted into the second sidewalls 152 of trenches and trench sections not covered by the protection layer 310.

Just for the purpose of illustration, in the example illustrated in FIG. 4C, the protection layer 310 covers each of the trenches 150 in the edge region. This. however, is only an example. According to another example, the protection layer 310 covers only some of the trenches 150 in the edge region and parts of the trench sections in the edge region so that along some trenches or trench sections in the edge region 120 first and second implanted regions of the same type as in the inner region 110 are produced.

In the example illustrated in FIGS. 4B and 4C, the first and second implanted regions 51, 52 in the edge region 120 are formed by the first and second implantation processes. The first implantation process forms a first part 41' of the first implanted regions 41 in the inner region 110 and the third implantation process finishes the first implanted regions 41. Equivalently, the second implantation process forms a first part 42' of the second implanted regions 42 in the inner region 110, and the fourth implantation process finishes these second implanted regions 42.

Referring to FIGS. 4B and 4C, a protection layer 210 can be formed on top of the mesa regions before the implantation processes, wherein the protection layer 210 prevents dopant atoms from being implanted into top surfaces $141_i$ of the mesa regions of the semiconductor layer $140_i$. According to one example, the protection layer 210 is the etch mask used in the etching process illustrated in FIG. 4A. Optionally, the etch mask 210 is removed before the implantation processes and another type of protection layer is formed on the first surface $141_i$.

Each of the first, second, third and fourth implantation processes is a tilted implantation process in which an implantation direction is inclined relative to the vertical direction z so that dopant atoms are implanted into the first and second sidewalls 151, 152. According to one example, the implantation angle is adjusted such that dopant atoms are implanted into the first and second sidewalls 151, 152, but not into the bottoms 153 of the trenches 150.

The first, second, third and fourth implantation processes can be implemented in various ways, that is, the first and second implanted regions 41, 51, 42, 52 can be formed in various ways:

(a) The semiconductor layer $140_i$ may be formed such that it has a basic doping of one of the first and second doping type, and only dopant atoms of the other one of the first doping type are implanted into each of the first and second sidewalls 151, 152 in the first, second, third, and fourth implantation processes. In this case, the implanted dopant atoms in the first and second implanted regions 41, 51, 42, 52—after the thermal process—form one of the first regions 11, 31 and second regions 12, 32. The other ones of the regions 11, 31 and the second regions 12, 32 are formed by those sections of the semiconductor layer $140_i$ in which the basic doping of the first doping type is maintained after the thermal process.

(b) The semiconductor layer $140_i$ may be formed such that it is intrinsic (that is, has a basic doping concentration lower than 1E14 cm$^{-3}$). Further, dopants of only one of the first and second doping type are implanted into the first sidewalls 151 in the first implantation process and the third implantation process (wherein in the third implantation process dopant atoms are only implanted into the trenches 150 not covered by the protection layer 310), and dopant atoms of only the other one of the first and second doping type are implanted into the second sidewalls 152 in the second implantation process and the fourth implantation process (wherein in the fourth implantation process dopant atoms are only implanted into trenches 150 not covered by the protection layer 310), so that the first and second implanted regions 41, 51, 42, 52 each include dopant atoms of only one of the first and second doping type. If, for example, the first implanted regions 41, 51 only include dopants of the first doping type and the second implanted regions 42, 52 only include dopants of the second doping type, the first implanted regions 41, 51 form the basis of the first regions 11, 31 and the second implanted regions 42 form the basis of the second regions 12, 32. According to one example, the implantation dose in the first implantation process is between 90% and 110% of the implantation dose in the second implantation process and the implantation dose in the third implantation process is between 90% and 110% of the implantation dose in the fourth implantation process.

(c) According to another example, both dopants of the first doping type and dopants of the second doping type are implanted into each of the first and second sidewalls 151, 152 in each of the first, second, third and fourth implantation process (wherein in the third and fourth implantation process dopant atoms are only implanted into trenches not covered by the protection layer 310), so that each of the first and second implanted regions 41, 42, 51, 52 includes both dopants of the first doping type and dopants of the second doping type. In this case, each of the first and second implanted regions 41, 42, 51, 52 forms the basis of a first region and a second region. Implanting dopant atoms of both the first doping type and the second doping type into respective ones of the first and second sidewalls 151, 152 may include two implantation sub-processes, a first implantation sub-process in which dopants of the first doping type are implanted, and a second implantation sub-process in which dopants of the second doping type are implanted. According to one example, an implantation dose in the first sub-process us between 90% and 110% of an implantation process in the second sub-process. According to another example, implanting both dopants of the first doping and dopants of the second doping type into respective ones of the first and second sidewalls 151, 152 includes only one implantation process in which dopants of the first doping type and dopants of the second doping type are implanted at the same time, for example, by implanting molecules that include both dopants of the first doping type and dopants of the second doping type in equal shares. According to one example, if dopant atoms of both types are implanted into one sidewall, the dopant atoms may be chosen such that they have different diffusion coefficients. According to one example, the first type dopant atoms are arsenic (As) or antimony (Sb) atoms, and the second type dopant atoms are boron (B) atoms. Boron, which is a p-type dopant, diffuses faster than As or Sb, which are n-type dopants.

In the example illustrated in FIGS. 4B and 4C, the first, second, third and fourth implantation processes are part of an overall implantation process in which dopant atoms are implanted into the first and second sidewalls 151, 152 of the trenches 150. In the edge region 120, trenches 150 are partly covered in this implantation process. Thus, fewer dopant atoms are implanted into the first and second sidewalls 151, 152 of the trenches 150 in the edge region 120 covered by the protection layer 310 than into the first and second sidewalls 151, 152 of the trenches 150 in the inner region 110. More specifically, at least some of the trenches 150 and at least parts of the trench sections in the edge region 120 are covered during the third and fourth implantation processes. According to one example, the first and second implantation processes and the third and fourth implantation processes are of the same type, that is, the first and second implantation processes are selected from one of options (a) to (c) explained above, and the third and fourth implantation processes are implantation processes according to the same option. When, for example, in the first and second implantation processes dopant atoms of both the first doping type and the second doping type are implanted into the first and second sidewalls 151, 152 dopant atoms of both the first doping type and the second doping type are also implanted into each of the first and second sidewalls 151, 152 of the trenches 150 (in the inner region 110) in the third and fourth implantation processes.

Figure 5:
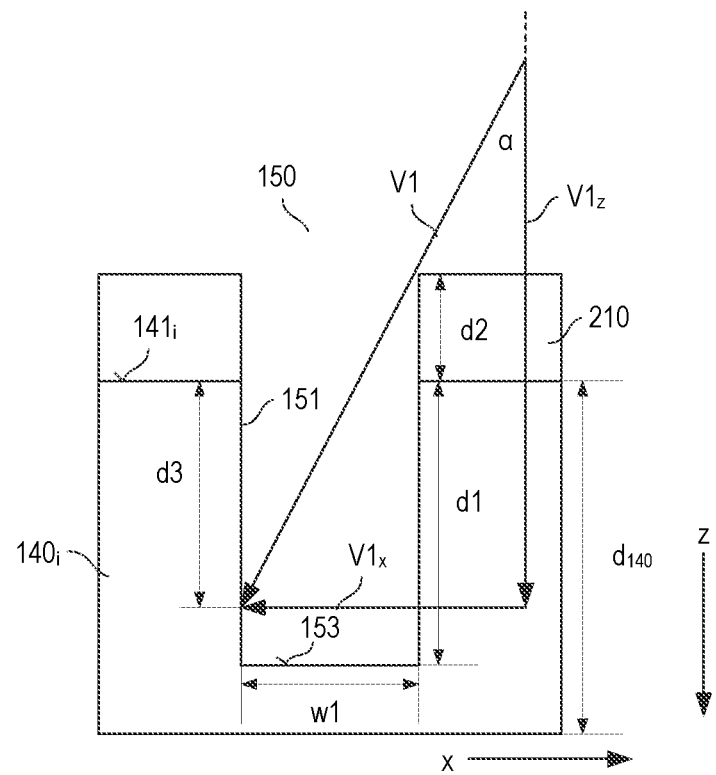
FIG. 5 illustrates one example of a method for implanting dopant atoms into one sidewall of a trench in greater detail.

FIG. 5 shows a vertical cross sectional view of one trench 150 in one of the implantation processes explained herein before. Just for the purpose of illustration, it is assumed that dopant atoms are implanted into the first sidewall 151 in the example illustrated in FIG. 5. This, however, is only an example. Everything explained with reference to FIG. 5 applies to implanting dopant atoms into the second sidewall 152 as well. In FIG. 5, V1 denotes an implantation vector, wherein the implantation vector V1 defines a direction in which the dopant atoms move towards the semiconductor layer $140_i$ during the implantation process. The implantation angle $\alpha$ is the angle between the implantation vector V1 and the vertical direction z of the semiconductor layer $150_i$. In FIG. 5, w1 denotes a width of the trench 150, d1 denotes a depth of the trench 150 and d2 denotes a thickness of the protection layer 210. Referring to the above, the implantation processes may be such that dopant atoms are implanted into the respective sidewall (the first sidewall in the example shown in FIG. 5), but not into the bottom 153 of the trenches 150. This can be obtained by adjusting the implantation angle $\alpha$ dependent on the trench width w1, the trench depth d1 and the protection layer thickness d2 such that $$\alpha > \arctan\left(\frac{w1}{d1+d2}\right). \tag{1}$$

According to one example, the implantation angle is equal to $$\arctan\left(\frac{w1}{d1+d2}\right),$$

so that dopant atoms are implanted into the layer $140_i$ along the entire depth d1 of the sidewall 151. According to another example, the implantation angle $\alpha$ is such that dopant atoms are not implanted into the sidewall 151 along its entire depth d1. In FIG. 5, d3 denotes then distance between the first surface $141_i$ and the deepest point of the trench sidewall 151 into which dopant atoms are implanted. This distance d3 is given dependent on the parameters mentioned above as follows:

$$d3 = \frac{w1}{\tan \alpha} - d2. \tag{2}$$

It should be noted that FIG. 5, for the purpose of explanation, illustrates an ideal case. In reality, scattering effects may cause that some dopant atoms are also implanted into sidewall sections that are more distant to the surface $141_i$ than d3 and/or that some dopant atoms are implanted into the bottom 153.

Referring to the above, dopant atoms of the first doping type can be implanted into one sidewall in a first sub-process and dopant atoms of the second doping type can be implanted into the same sidewall in a second sub-process. In this case, different implantation angles $\alpha$ can be used in the first and second sub-process. For example, dopant atoms that diffuse faster may be implemented with a larger tilt angle $\alpha$ than dopant atoms that diffuse slower. The amount of dopant atoms implanted into the sidewall 151 in one implantation process is given by the implantation dose D multiplied with the area into which dopant atoms are implanted. The dopant dose D is given by $$D = I \cdot \sin \alpha \tag{3},$$

where I is the implantation dose used in the respective implantation process. The implantation dose is essentially given by the number of dopant atoms that pass an area of a predefined size in a plane perpendicular to the implantation direction in the implantation process. (The implantation dose is usually given as number of dopant atoms per $cm^{-2}$). The "area into which dopant atoms are implanted" is given by the depth d3 multiplied with a length l of the trench sidewall 151. The length of the trench sidewall is the dimension of the trench sidewall in the second lateral direction y. Thus, the amount N of dopant atoms implanted into one sidewall is given by:

$$N = D \cdot l \cdot d3 = I \cdot \sin \alpha \cdot l \cdot d3 \tag{4a},$$

and the amount N/l of dopant atoms per length unit is given by $$N/l = D \cdot d3 = I \cdot \sin \alpha \cdot d3 \tag{4b}.$$

Referring to the above, the first and second regions 11, 12, 31, 32 are formed based on the first and second implanted regions 41, 42, 51, 52. Assume, for example, that one first region 11, 31 is formed based on dopant atoms of the first doping type implanted into one sidewall and that n semiconductor layers $140l$-$140n$ are formed one on top of the other and that the implantation dose $I_D$ of dopant atoms of the first doping type and the implantation angle $\alpha$ is the same in each of these semiconductor layers. In this case, the amount $N_{D\_TOT}/l$ of dopant atoms of the first doping type per length unit of the first region 11, 31 is given by $$N_{D\_TOT}/l = D_D \cdot d3 \cdot n = I_D \cdot \sin \alpha \cdot d3 \cdot n \tag{5}.$$

Thus, by suitably selecting the implantation dose and the implantation angle, the number of dopant atoms in a first region 11, 31 and, equivalently, the second region 12, 32 can be adjusted.

Referring to FIGS. 4A-4C, first and second implanted regions 41, 42 in trenches 150 not covered by the protection layer 310 are formed by two respective implantation processes and first and second implanted regions 41, 42 in trenches 150 covered by the protection layer 310 are formed by one respective implantation process. In the following, $I_1$ denotes a first implantation dose used in the first and second implantation processes, and $I_2$ denotes a second implantation dose used in the third and fourth implantation processes and $I_{TOT}=I_1+I_2$ denotes an overall implantation dose wherein this overall implantation dose is only implanted into the first and second sidewalls 151, 152 of those trenches 150 not covered by the protection layer 310. According to one example, the first implantation dose $I_1$ is between 50% and 90% of the overall implantation dose $I_{TOT}$ so that the second implantation dose $I_2$ is between 10% and 50% of the overall implantation dose $I_{TOT}$. In this case, the amount of dopant atoms in first or second regions 31, 32 that are formed based on first and second implanted regions 51, 52 is between 50% and 90% of the amount of dopant atoms in first or second regions 31, 32 that are formed based on first and second implanted regions 41, 42.

Figure 6:
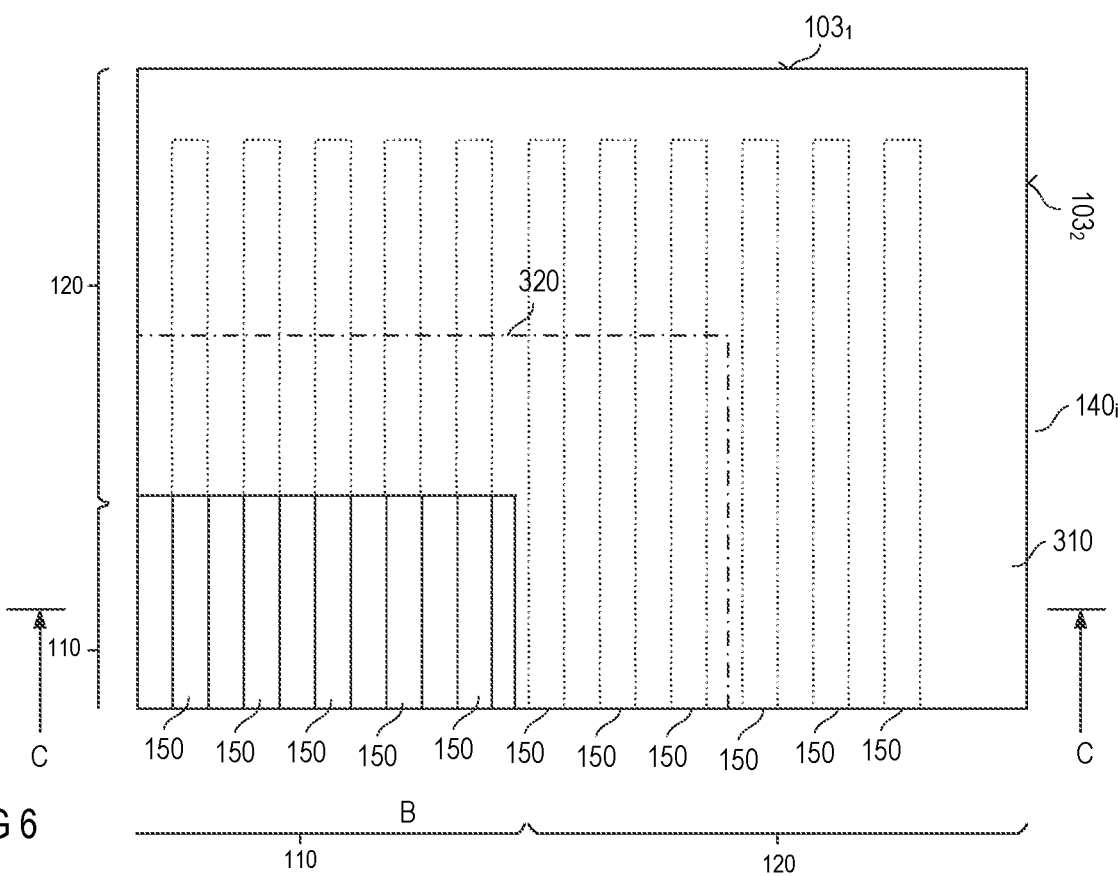
FIG. 6 illustrates a top view of a corner section of the semiconductor layer shown in FIG. 4C.

Referring to the above, the protection layer 310 covers the trenches 150 in the edge region 120 during the third and fourth implantation process. FIGS. 4A to 4C show a vertical cross sectional view of the semiconductor layer $140_i$ in a vertical section plane that is parallel to the first horizontal direction x and goes through the inner region 110 and the edge region 120. FIG. 6 shows a top view of the semiconductor layer $140_i$ according to FIG. 4C. The dotted lines in FIG. 6 illustrate the position of the trenches 150 below the protection layer. As can be seen from FIG. 6, the protection layer 310 covers the trenches 150 in the edge region 120 along each of the edge surface sections (wherein in FIG. 6 only two $103_1$, $103_2$ of the edge surface sections are illustrated), so that along sidewall section $103_2$ entire trenches are covered by the protection layer 310 in the edge region 120 and along sidewall section $103_2$ trench sections are covered by the protection layer 310 in the edge region 120.

Figure 7A:
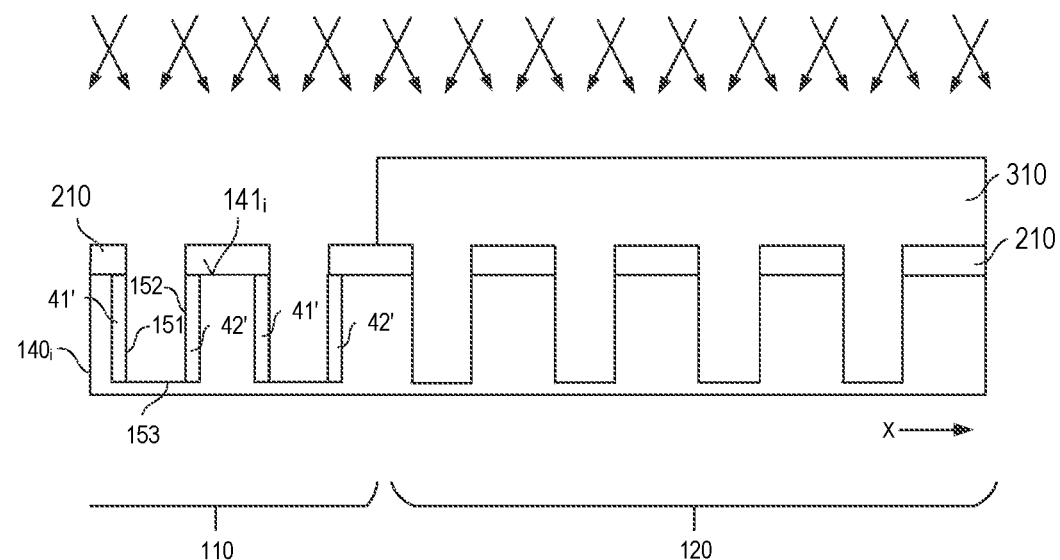
FIGS. 7A and 7B illustrate a modification of the method shown in FIGS. 4A to 4C.
Figure 7B:
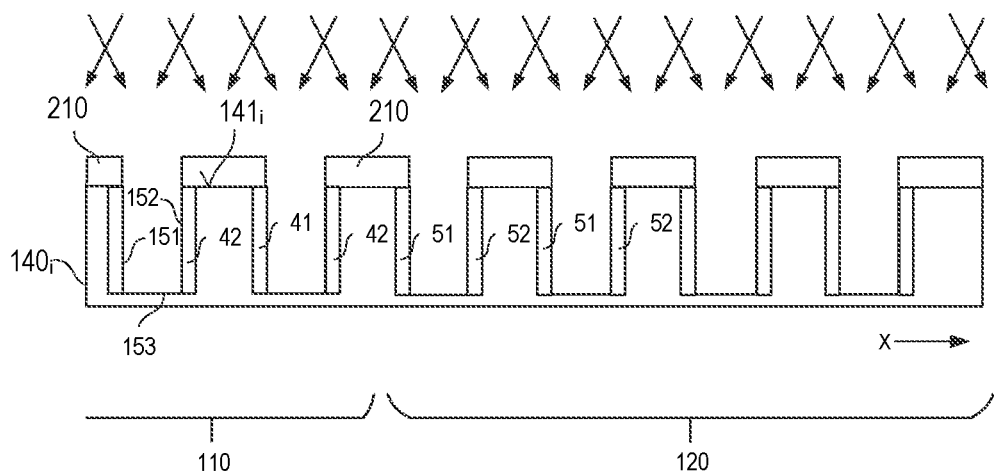

In the example illustrated in FIGS. 4B and 4C, the first and second implantation processes are performed before the third and fourth implantation processes. This, however, is only an example. According to another example illustrated in FIGS. 7A and 7B, the third and fourth implantation processes, during which trenches 150 in the edge region 120 are covered by the protection layer 310, take place before the first and second implantation processes in which dopant atoms are implanted into the sidewalls 151, 152 of each of the trenches 150 in the inner region 110 and the edge region 120. FIG. 7A shows a vertical cross sectional view of the semiconductor layer $140_i$ during the third and fourth implantation process, and FIG. 7B shows a vertical cross sectional view $140_i$ of the semiconductor body during the first and second implantation process.

In the methods illustrated in FIGS. 4A to 4C and 7A to 7B, there are two types of first implanted regions, first implanted regions 41 in the inner region 110 that have a dopant dose resulting from the first and third implantation process, and first implanted regions 51 in the edge region 120 that have a dopant dose resulting from the third implantation process. Equivalently, there are two types of second implanted regions, second implanted regions 42 in the inner region that have a dopant dose resulting from the second and fourth implantation process and second implanted regions 52 that have a dopant dose resulting from the fourth implantation process.

In this way, the overall amount of dopant atoms included in the first and second implanted regions 51, 52 in the edge region 120 is lower than the overall amount of dopant atoms in the first and second implanted regions 41, 42 in the inner region 110. Referring to the above, the first and second regions 11, 12 in the inner region 110 result from the first and second implanted regions 41, 42 in the inner region 110, and the first and second regions 31, 32 in the edge region 120 result from the first and second implanted regions 51, 52 formed in the edge region 120. As the first and second implanted regions 51, 52 in the edge region 120 include less dopant atoms than the first and second implanted regions 41, 42 in the inner region 110, the first and second regions 31, 32 in the edge region 120 include less dopant atoms than the first and second regions 11, 12 in the inner region 110, as desired.

Figure 8A:
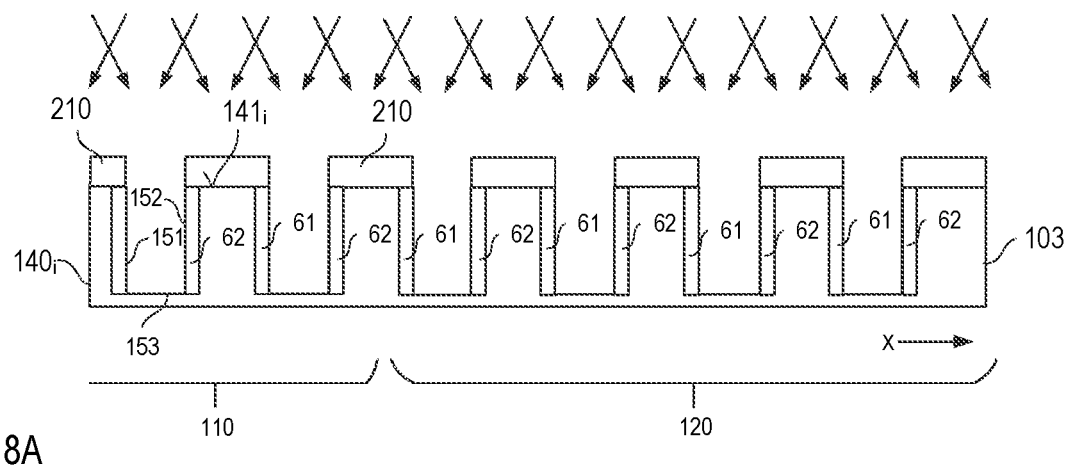
FIGS. 8A to 8C illustrate a further modification of the method shown in FIGS. 4A to 4C.
Figure 8B:
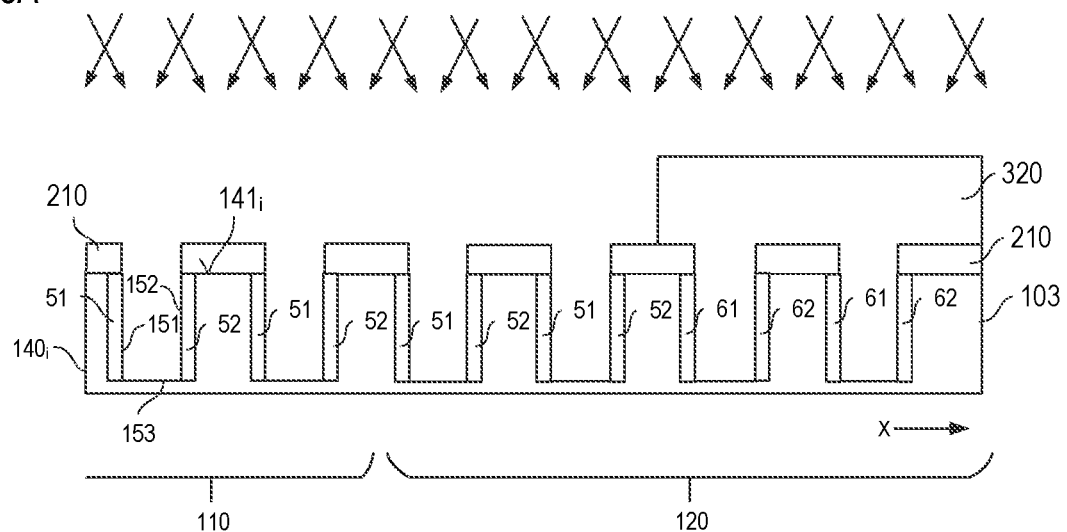
Figure 8C:
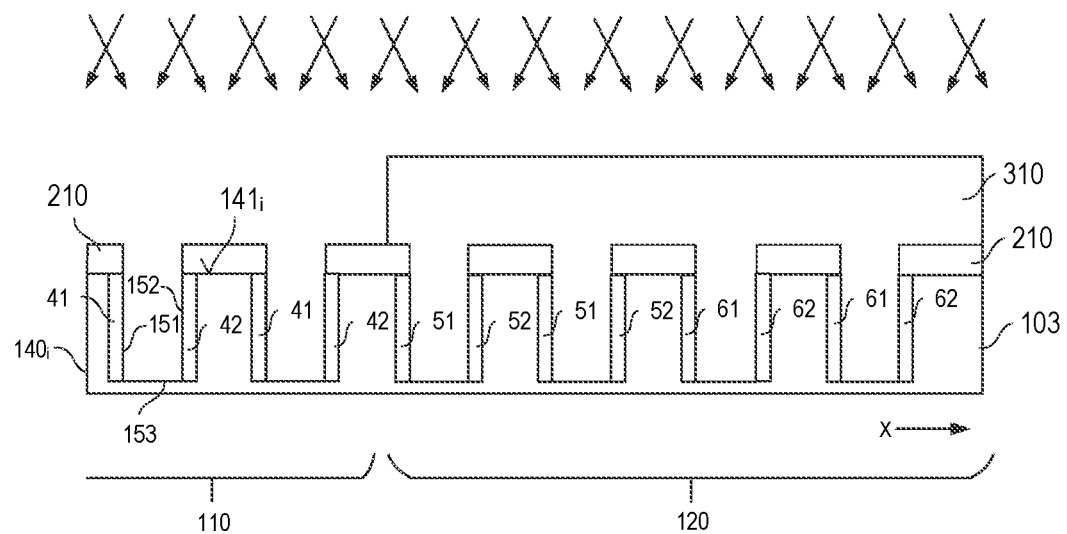

According to one example, the first and second regions 31, 32 in the edge region 120 are produced such that the amount of dopant atoms per length unit decreases towards the edge surface 103. FIGS. 8A to 8C illustrate one example of a method by which this can be obtained. Each of FIGS. 8A to 8C shows the vertical cross sectional view of one semiconductor layer $140_i$ during different process steps. FIG. 8A shows the semiconductor layer $140_i$ during the first and second implantation process explained above, and FIG. 8C shows the semiconductor layer $140_i$ during the third and fourth implantation process explained above. Additionally to these implantation processes, the method illustrated in FIGS. 8A to 8C includes two further implantation processes, a fifth implantation process and a sixth implantation process illustrated in FIG. 8B. During the fifth and sixth implantation process a further protection layer 320 covers some of the trenches 150 or trench sections that are also covered by the protection layer 310 in the third and fourth implantation process, but the further protection layer 320 covers less trenches 150 or smaller trench sections than the protection layer 310. A top view of the further protection layer 320 is illustrated in dashed and dotted lines in FIG. 6. In the fifth implantation process, dopant atoms are implanted into the first sidewalls 151 of the trenches 150 not covered by the further protection layer 320, and in the sixth implantation process dopant atoms are implanted into the second sidewalls 152 of the trenches 150 or trench sections not covered by the further protection layer 320. It should be noted that the order in which the implantation processes are performed is arbitrary. In the example illustrated in FIGS. 8A to 8C, the fifth and sixth implantation process follow the first and second implantation process and the third and fourth implantation process follow the fifth and sixth implantation process. This, however, is only an example.

The method illustrated in FIGS. 8A to 8C results in three different types of first and second implanted regions: (1) First and second implanted regions 41, 42 in the inner region 110, which result from the first, third and fifth and second, fourth and sixth implantation process, respectively; (2) the first and second implanted regions 51, 52 in the edge region 120 which result from the first and third and the second and fourth implantation process, and (3) the first and second implanted regions 61, 62 in the edge region 120 which result from the first and second implantation process, only. The first and second implanted regions 61, 62 include less dopant atoms than the first and second implanted regions 51, 52, wherein the latter include less dopant atoms than the first and second implanted regions 41, 42. According to one example, implantation doses in the first to sixth implantation processes are selected such that the dopant doses in the implanted regions 61, 62 formed by the first, third, second and fourth implantation process are between 70% and 90% of dopant doses of the implanted regions 41, 42 in the inner region 110 (which are formed by the first to sixth implantation process). Further, the dopant doses in the implanted regions 71, 72 formed by the first and second implantation process, only, are between 50% and 70% of dopant doses of the implanted regions 41, 42 in the inner region 110.

Figure 9:
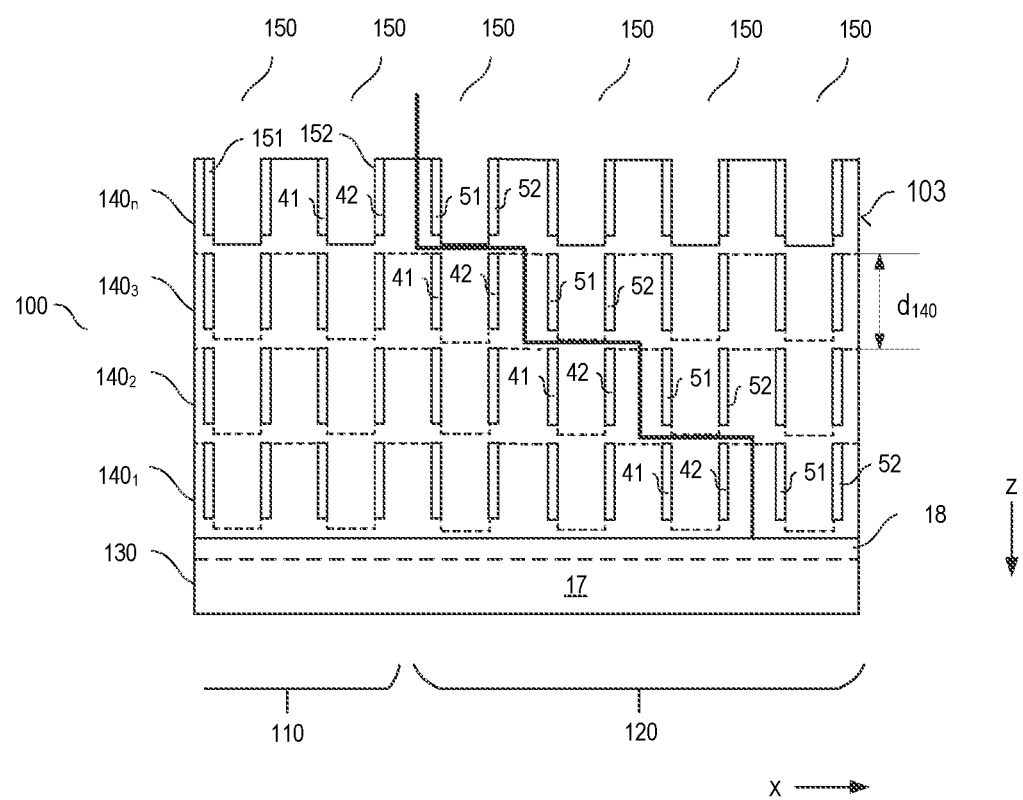
FIG. 9 illustrates how the protection layer may be positioned on top of several semiconductor layers.

FIGS. 4A to 4C, 7A to 7B and 8A to 8C illustrate one semiconductor layer during the process of forming first and second implanted regions along first and second sidewalls 151, 152 of trenches 150. According to one example, the same process is used in each of the semiconductor layers $140_i$. According to another example, a method as illustrated in FIG. 4A to 4C or 7A to 7B is used in each of the semiconductor layers $140_1$-$140_n$, wherein the area covered by the protection layer 310 in the third and fourth implantation process may vary such that the farther the respective semiconductor layer $140_i$ is distant from the carrier 130 the greater the area covered by the protection layer 310. This is illustrated in FIG. 9, which shows the semiconductor body 100 after forming the plurality of semiconductor layers $140_1$-$140_n$ and forming implanted regions in the individual semiconductor layers $140_1$-$140_n$. The trenches in the individual semiconductor layers $140_i$ are illustrated in dashed lines in FIG. 9. Further, the bold line in FIG. 9 illustrates the border of the protection layers 310 used in the respective third and fourth implantation process. That is, the trenches or trench sections between this line and the edge surface 103 are trenches that are covered by the respective layer during the third and fourth implantation process. In this example, in the finished device, there may be first and second regions 31, 32 in the edge regions that result from first or second doped regions 41, 42 with a higher amount of dopant atoms and from first or second doped regions 51, 52 with a lower amount of dopant atoms.

In the methods explained herein before, trenches 150 or trench sections in the edge region 120 are partly covered during the implantation process. In these examples, "partly" covered includes temporarily covered during the implantation process. In the example illustrated in FIGS. 4A to 4C, for example, trenches and trench sections in the edge region 120 are covered by the protection layer 310 during the third and fourth implantation process, which form a part of the overall implantation process. In this type of process, the protection layer 310 completely covers the trenches in the edge region 120 or completely covers at least a ring-shaped section of the edge region 120.

Figure 10:
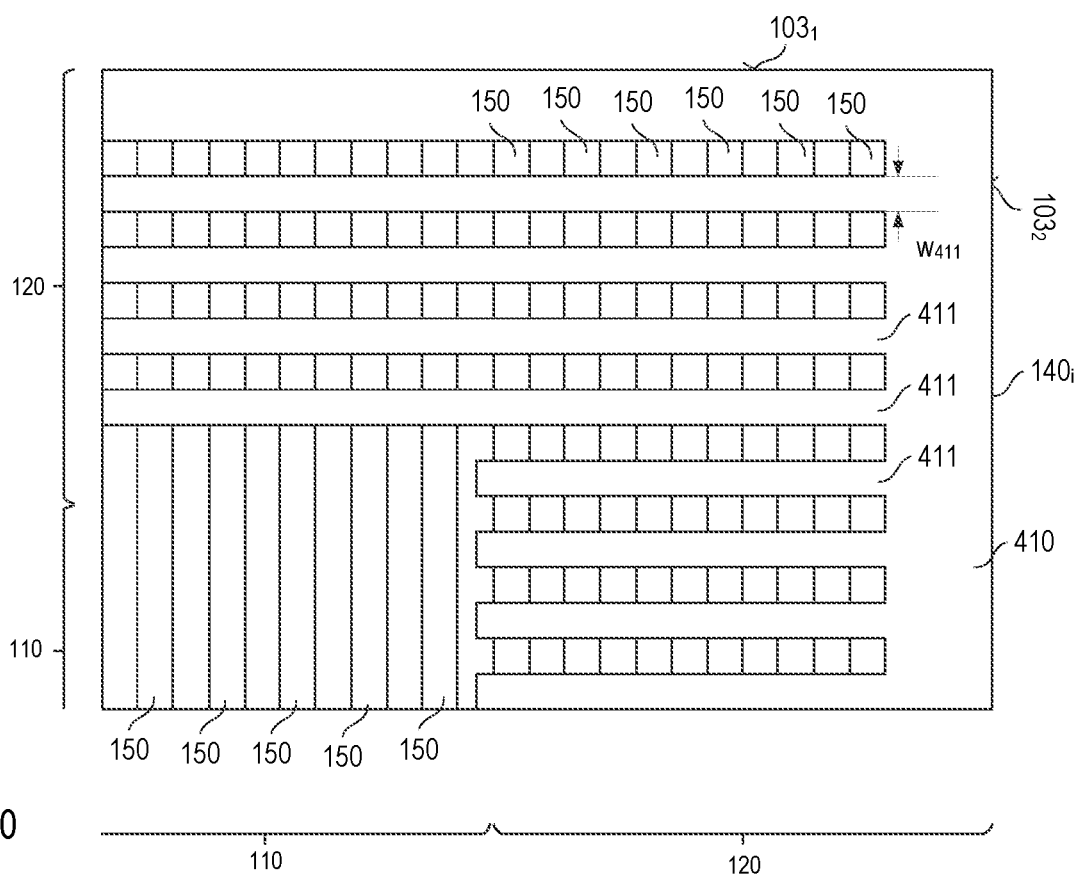
FIG. 10 illustrates a top view of a semiconductor layer and a protection layer formed thereon.

According to another example, partly covering trenches or trench sections in the edge region 120 includes implementing the protection layer such that it covers sections of the trenches 150 in the edge region 120, but leaves other sections of the same trenches in the edge region 120 uncovered. A top view of one example of this type of protection layer 410 is illustrated in FIG. 10. In this example, the protection layer 410 includes a plurality of parallel sections 411, wherein these layer sections 411 are essentially perpendicular to the trenches 150.

Figure 11A:
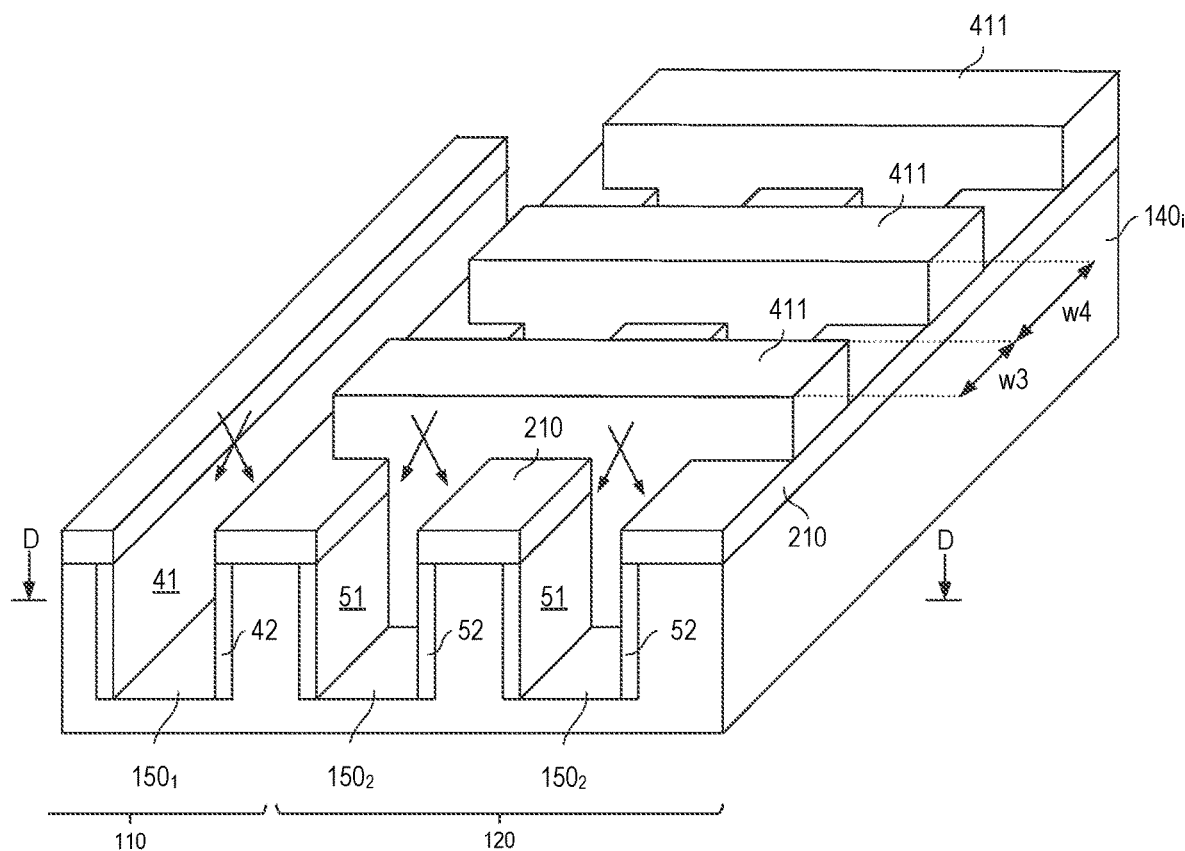
FIGS. 11A and 11B illustrate perspective sectional view and a horizontal cross sectional view of the semiconductor layer shown in FIG. 10 after an implantation process.
Figure 11B:
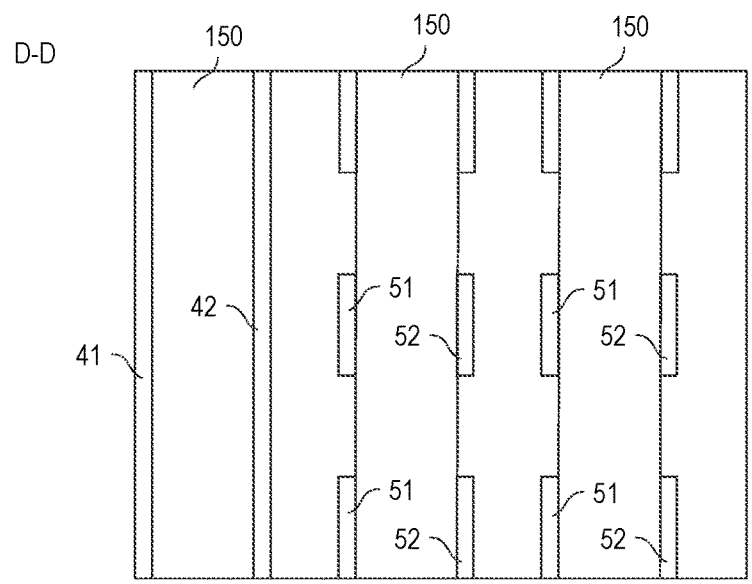

FIG. 11A shows a perspective sectional view of the semiconductor layer $140_i$ shown in FIG. 10 during a first and second implantation process, and FIG. 11B shows a horizontal cross sectional view of one section of the semiconductor layer in a section plane C-C illustrated in FIG. 11A. Each of the first and second implantation process is a tilted implantation process. Everything explained herein before with regard to the first and second implantation process applies to the first and second implantation process illustrated in FIG. 11A as well, the only difference being that there is not necessarily a third and fourth implantation process so that 100% of the desired amount of dopant atoms can be implanted into the first and second sidewalls 151, 152 in the first and second implantation process. Referring to FIG. 11A, trenches 150 in the inner region 110 are not covered by the protection layer 410, while sections of the trenches in the edge region 120 are covered by the protection layer sections 411. Thus, first and second implanted regions 41, 42 formed in the inner region 110 are contiguous regions that extend along the complete first and second sidewalls 151, 152 in the inner region 110. In the edge region 120, a plurality of first implanted regions 51 are formed along first sidewalls 151 and a plurality of second implanted regions 52 are formed along second sidewalls 152 of the trenches 150. The first implanted regions 51 are spaced apart from each other in the horizontal direction of the respective trench 150, and the second implanted regions 52 are spaced apart from each other in the longitudinal direction of the respective trench 150. In the inner region 110, the overall amount of dopant atoms included in one of first and second implanted regions 41, 42 is essentially proportional to a length of the respective implanted region 41, 42 in the longitudinal direction of the respective trench 150 and the implantation dose. In the edge region 120, the overall amount of dopant atoms implanted into one of the first and second sidewalls 151, 152 is proportional to the length of the respective trench, the implantation dose, and a ratio w3/(w3+w4), where w3 is a width of the protection layer sections 411 and w4 is a distance between two neighboring sections 411. Thus, the amount of dopant atoms included in one of the first and second sidewalls 151, 152 in a trench 150 in the edge region 120 relative to the amount of dopant atoms included in one of the first and second sidewalls 151, 152 of a trench 150 in the inner region 110 can be adjusted by suitably adjusting the width w3 of the protection layer sections and the distance between these sections of the protection layer.

The protection layer 410 is a resist, for example. The protection layer 410 can be patterned by a lithographic process, for example.

Figure 12:
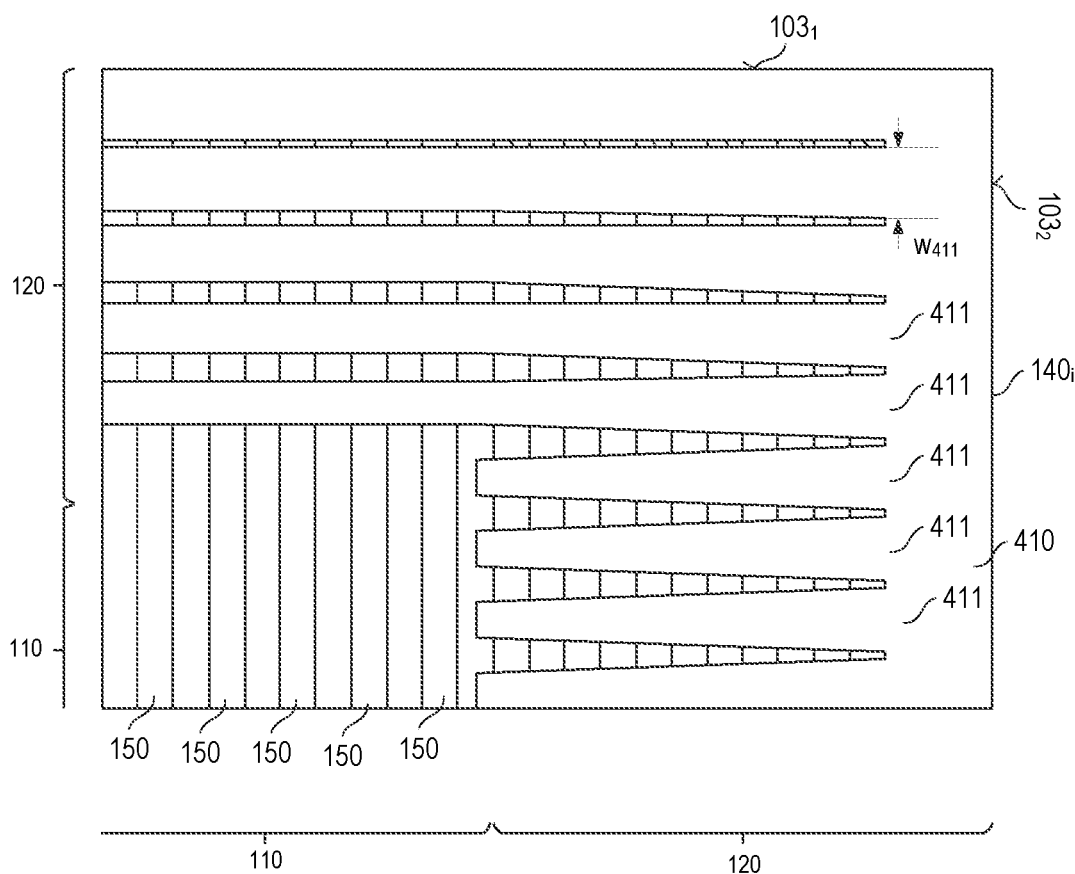
FIG. 12 shows a top view of a protection layer according to another example.

According to one example illustrated in FIG. 12, the protection layer 410 is formed such that the distance between two neighboring protection layer sections 411 decreases towards the edge surface 103. In this way, the amount of dopant atoms implanted into the sidewall of one trench 150 decreases towards the edge surface 103. In each of the examples explained with reference to FIGS. 11A to 11B and 12, a width of the protection layer sections 411 may be between 0.25 times and 4 times a width of the mesa regions (wherein the widths of the mesa regions are equal to a shortest distance between two neighboring trenches 150).

Referring to the above, the buffer region 18 can be produced by epitaxially growing a semiconductor layer 131 on top of the semiconductor substrate 130 and in-situ doping the epitaxial layer 131 during the epitaxial growth process. A buffer region 18 produced in this way has an essentially homogenous doping concentration in the inner region 110 and the edge region 120 of the semiconductor body.

According to one example, forming the first and second implanted regions in the edge region 120 of each of the plurality of semiconductor layers $140_1$-$140_n$ may be formed using one of the processes explained above so that in each of the semiconductor layers $140_1$-$140_n$ at least some of the first and second implanted regions 51, 52, 61, 62 in the edge region 120 have a lower dopant dose than first and second implanted regions 41, 42 in the inner region 110. This, however, is only an example. Basically, one of the methods explained with reference to semiconductor layer $140_i$ herein above is applied to at least one of the semiconductor layers $140_1$-$140_n$. Thus, there may be one or more of the semiconductor layers $140_1$-$140_n$ in which no protection layer 310 is formed in the edge region so that the first and second implanted regions in the edge region 120 are formed in the same way as the first and second implanted regions 41, 42 in the inner region 110 and so that the first and second regions in the inner region 110 and the edge region have essentially the same dopant dose.

According to one example, at least one of the semiconductor layers $140_1$-$140_n$, but less than each of the semiconductor layers $140_1$-$140_n$, is processed as explained with reference to semiconductor layer $140_i$ above, wherein this at least one semiconductor layer is different from the lowermost layer $140_1$ and the uppermost layer $140_n$. According to one example, this at least one semiconductor layer is approximately in the middle between the lowermost layer $140_1$ and the uppermost layer $140_n$.

According to one example, the at least one of the semiconductor layers $140_1$-$140_n$ that is processed as explained with reference to semiconductor layer $140_i$ above includes between 20% and 100% or between 50% and 100% of the semiconductor layers $140_1$-$140_n$.

In case several of the semiconductor layers $140_1$-$140_n$ are processed as explained with reference to semiconductor layer $140_i$ herein above, each of these several layers may be processed by the same type of process such as one of the processes explained with reference to FIGS. 4A to 4C, FIGS. 7A to 7C, FIG. 8A to 8C, FIGS. 10, 11A and 11B, or FIG. 12. However, it is also possible to use at least two different processes for processing the several semiconductor layers.

Figure 13A:
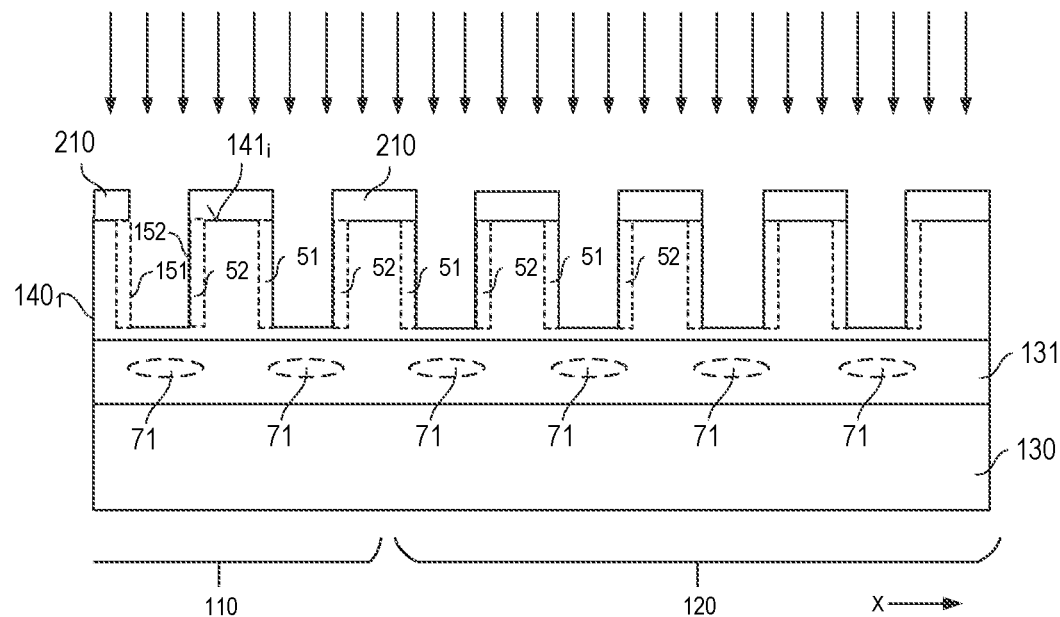
FIGS. 13A and 13B illustrate one example of a method form forming a buffer region.
Figure 13B:
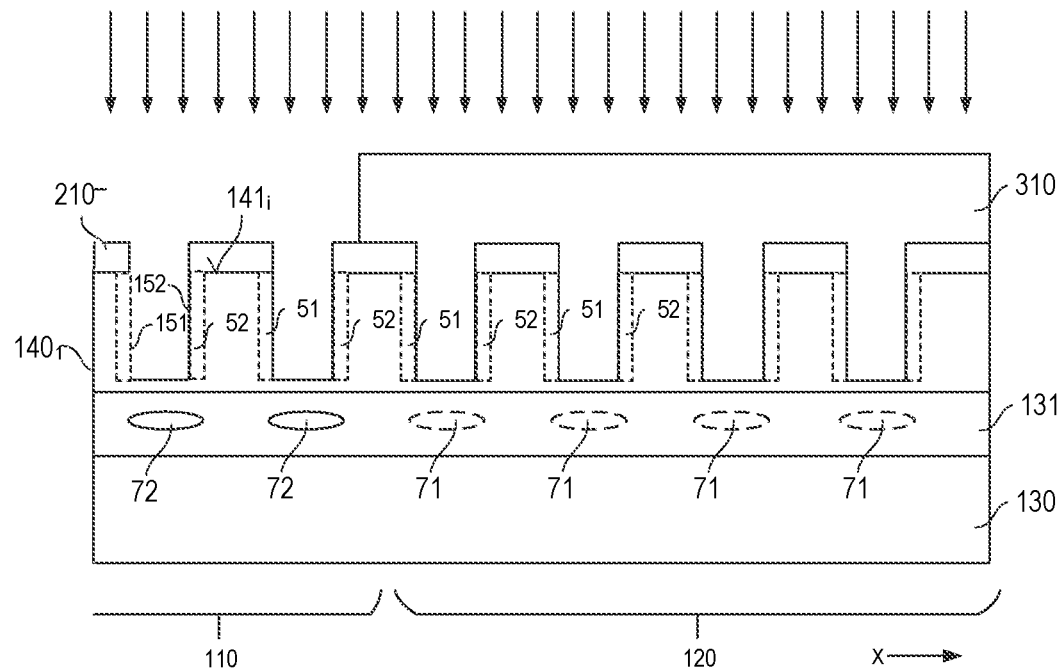

According to one example, it is desired to produce the buffer region 18 such that a doping concentration of the buffer region 18 is lower in the edge region 120 than the inner region 110. FIGS. 13A and 13B illustrate one example of a method for producing the buffer region 18 in this way. The method illustrated in FIGS. 13A and 13B is similar to the method illustrated in FIGS. 4A to 4C and 7A to 7B and is different from these methods in that after forming the trenches 150 in the lowermost semiconductor layer $140_1$ dopant atoms are implanted via bottoms 153 of the trenches 150 into the epitaxial layer 131, wherein the epitaxial layer 131 is either intrinsic or has a very low doping concentration, such as lower than $1E15$ $cm^{-3}$. Further, only dopant atoms of the first doping type are implanted into the epitaxial layer 131 via the bottoms 153 of the trenches 150.

A decreasing doping concentration of the buffer region 18 towards the edge surface 103 is obtained in that in a first implantation process dopant atoms are implanted into the bottom 153 in each of the trenches 150 and in each of the trench sections. In a further implantation process, illustrated in FIG. 13B, dopant atoms are implanted into the bottoms 153 of those trenches 150 not covered by the protection layer 310. In this way, first implanted regions 71 are produced in the edge region 120, and second implanted regions 72 are produced in the inner region 110, wherein the amount of dopant atoms in each of the first implanted regions 71 is lower than the amount of dopant atoms in each of the second implanted regions 72. According to one example, an implantation dose in the further implantation process is between $1E11$ $cm^{-2}$ and $1E13$ $cm^{-2}$, in particular between $8E11$ $cm^{-2}$ and $5E12$ $cm^{-2}$.

In the method illustrated in FIGS. 13A and 13B, the first implantation process is optional, that is, forming the first implanted regions 71 is optional. When the first implantation process is omitted a doping concentration of the buffer region 18 in the edge region equals a basic doping of the epitaxial layer 131. According to one example, the first implanted regions 71 in the edge region 120 and the second implanted region 72 in the inner region 110 are formed such that a ratio between a dopant dose in the second implanted regions 72 and a ratio between a dopant dose in the first implanted regions 71 essentially equals a ratio between a dopant dose in the first and second implanted regions 41, 42 in the inner region 110 and a dopant dose in the first and second implanted regions 51, 52 in the edge region 120.

Figure 14A:
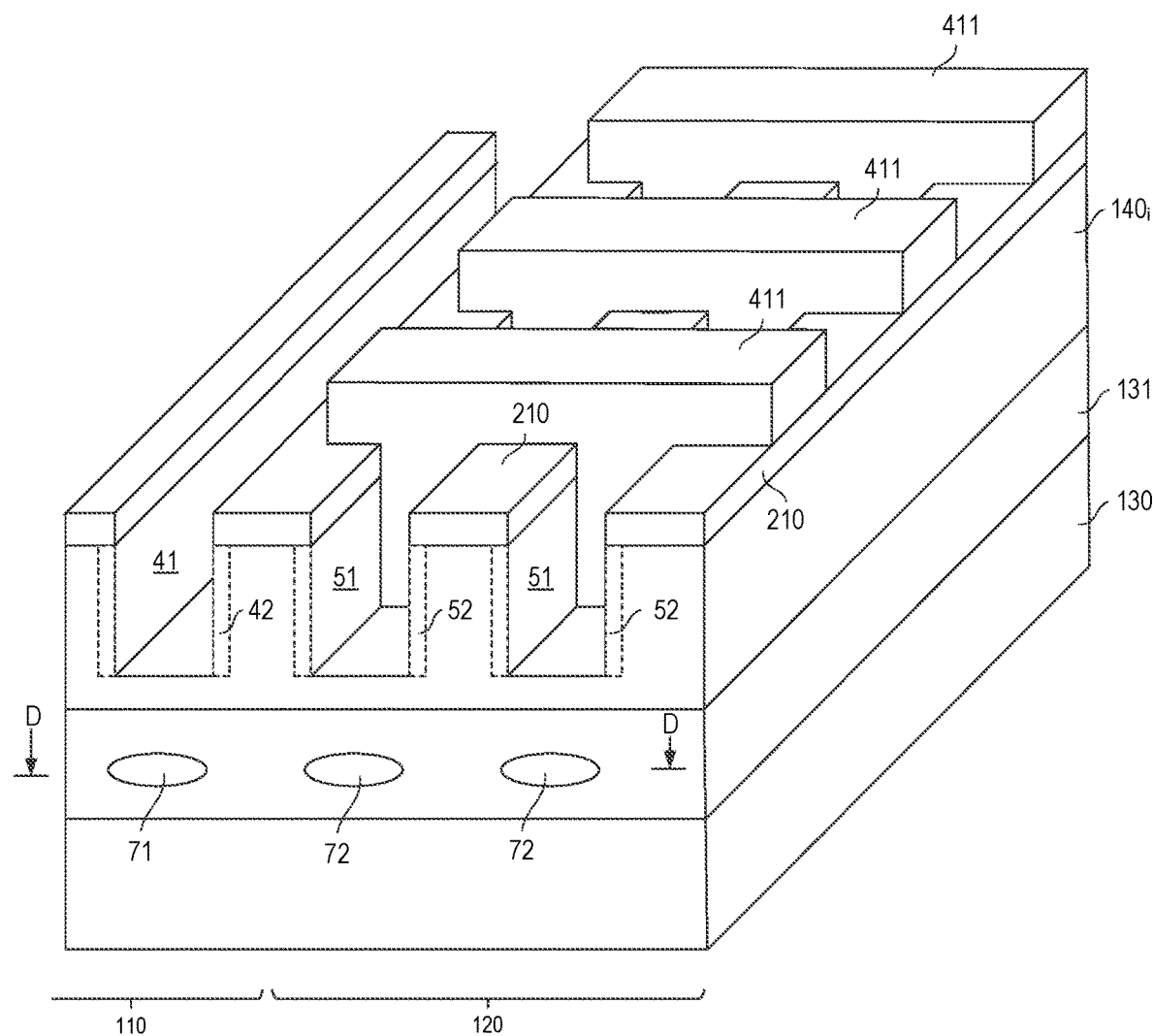
FIGS. 14A and 14B illustrate another example of a method form forming a buffer region.
Figure 14B:
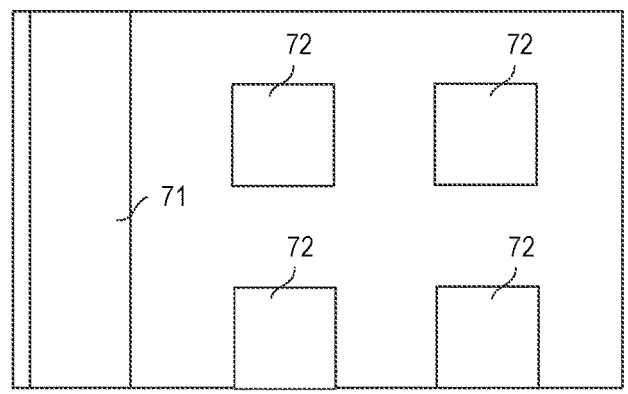

FIGS. 14A and 14B illustrate another example of a method for forming first implanted regions 71 in the inner region 110 and second implanted regions 72 in the edge region 120. In this example, the protection layer 410 on the lowermost semiconductor layer $140_1$ is used to form these implanted regions. Like in the method illustrated in FIGS. 13A and 13B, dopant atoms are implanted into the epitaxial layer 131 via the bottoms of the trenches 150. In this way, below the bottoms of the trenches 150 in the inner region 110 a contiguous first implanted region 71 and below the bottoms 153 of the trenches 150 in the edge region 120 several implanted regions that are spaced apart from each other in the longitudinal directions of the trenches are formed. FIG. 14A shows a perspective cross sectional view of one section of the lowermost semiconductor layer $140_1$, the epitaxial layer 131 and the semiconductor substrate 130 after the implantation process, and FIG. 14B shows a horizontal cross sectional view of the epitaxial layer 131 after the implantation process.

Figure 15:
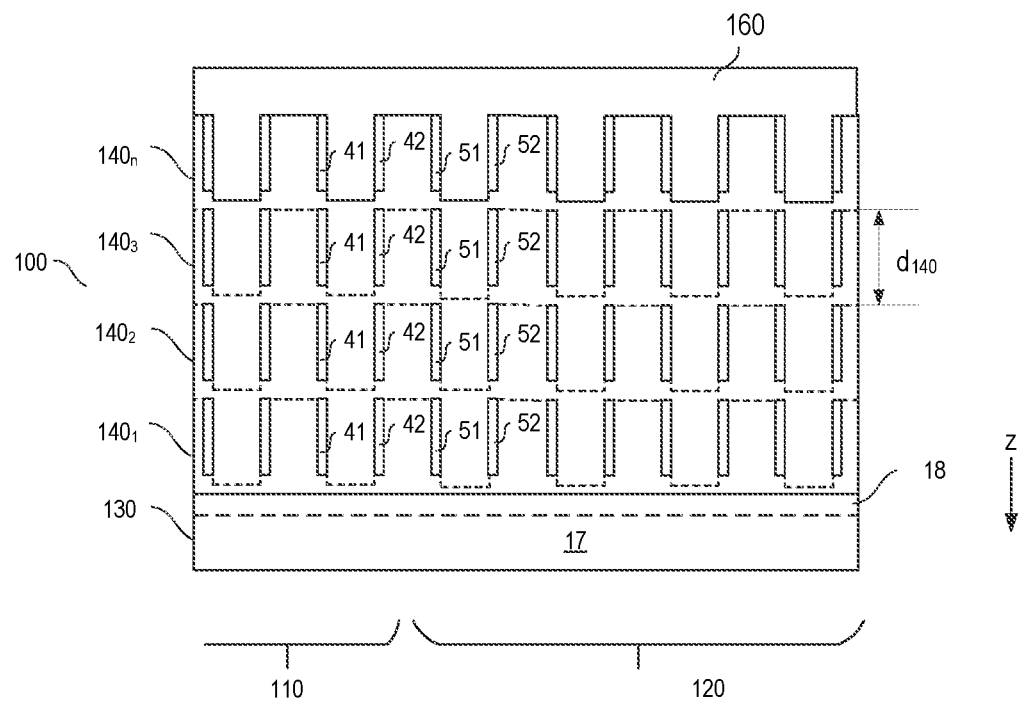
FIG. 15 illustrates forming a further semiconductor layer on top of an uppermost one of the plurality of semiconductor layers.

FIG. 15 shows the arrangement with the plurality of semiconductor layers $140_1$-$140_n$ after a further process step. This process step includes forming a further semiconductor layer 160 on top of the uppermost semiconductor layer $140_n$. This further semiconductor layer 160 fills the trenches 150 in the uppermost semiconductor layer $140_n$. Forming this further semiconductor layer 160 may include an epitaxial growth process.

Figure 16:
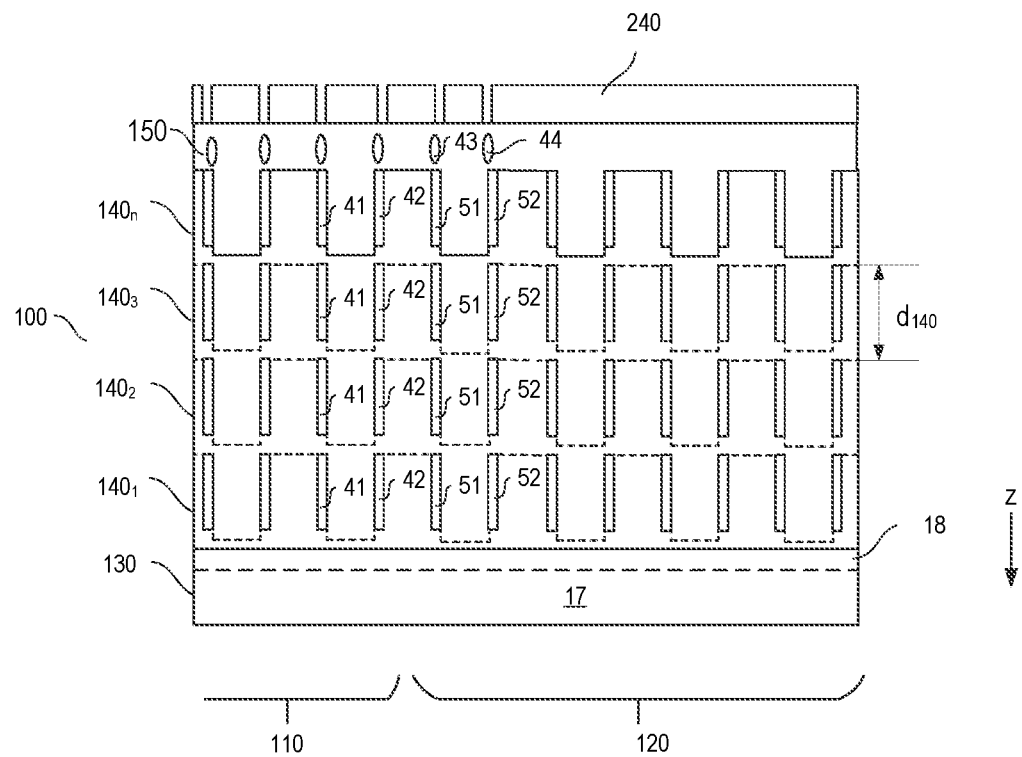
FIG. 16 illustrates an optional implantation process.

Referring to FIG. 16, the method may further include forming, in the further semiconductor layer 160, at least one third implanted region 43 above the first implanted regions 41 in the inner region 110 and at least one fourth implanted region 44 above the second implanted regions 42 in the inner region 110 using at least one further implantation mask 240. The third implanted regions 43 are of the same type as the first implanted regions 41. That is, the third implanted regions 43 either include dopants of only one of the first and second doping type or dopants of both doping types, and the fourth implanted regions 44 either include dopants of only one of the first and second doping types or dopants of both doping types. According to one example, the first and second implanted regions 41, 42 each include dopants of the first doping type and the second doping type. In this example, the third and fourth implanted regions are formed such that each of the third and fourth implanted regions 43, 43 includes both dopant atoms of the first doping type and dopant atoms of the second doping type. Third and fourth implanted regions of this type may be formed by using only one implantation mask 240 (illustrated in FIG. 16) that has openings at positions above the first and second implanted regions 41, 42.

Figure 17:
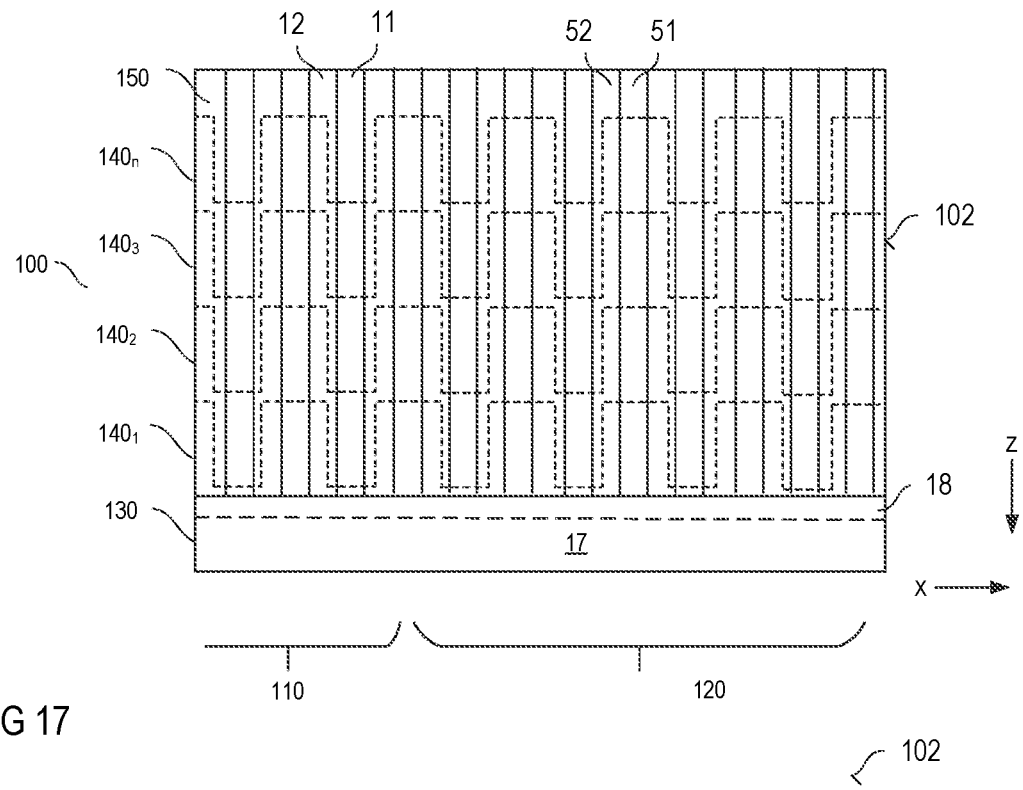
FIGS. 17 and 18 each illustrate the arrangement according to FIG. 15 after a thermal process.
Figure 18:
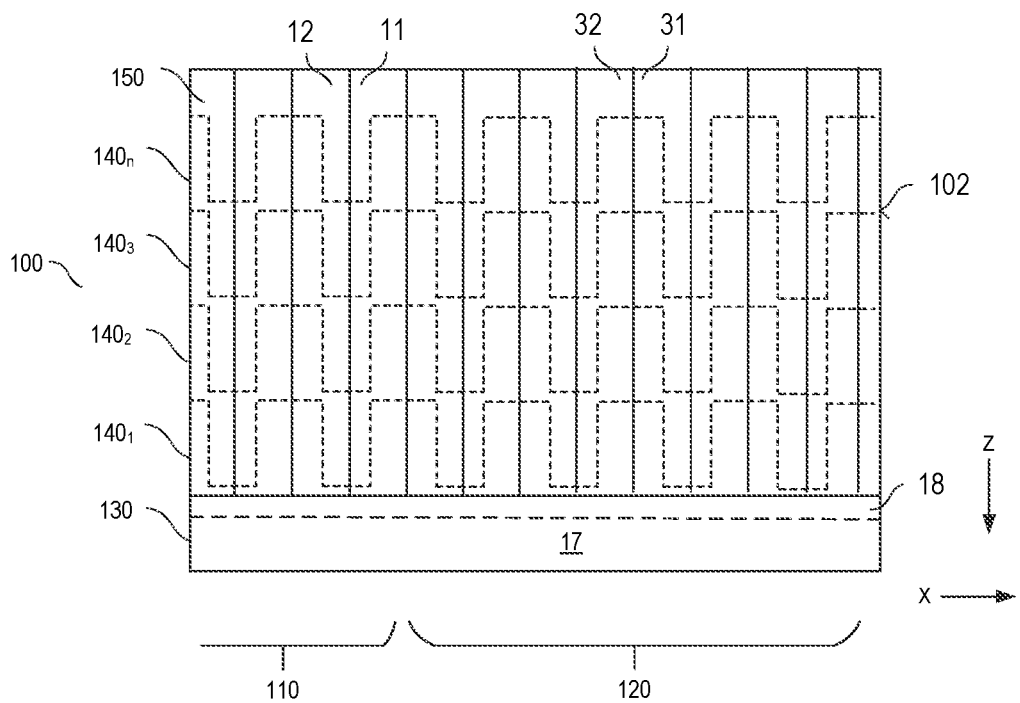

The method further includes a temperature process in which the dopants in the first and second implanted regions 41, 42, 51, 52, the dopant atoms in the optional third and fourth implanted regions 43, 44, and the dopant atoms in the optional implanted regions 71, 72 in the epitaxial layer 131 are activated and diffuse in order to form the first regions 11, 31 and the second regions 12, 32 in the inner region 110 and the edge region 120 and the optional buffer region 18. According to one example, a temperature in the thermal process is between 1000° C. and 1200° C., and the duration of the thermal process is between 20 minutes and 10 hours. Optionally, the temperature process takes place in an oxidizing or wet oxidizing atmosphere. FIG. 17 shows a vertical cross sectional view of the semiconductor body 100 after the thermal process FIG. 17 illustrates an example in which the first and second regions 11, 12, 31, 32 result from first and second implanted regions 41, 42, 51, 52 that include dopant atoms of both the first doping type and the second doping type. FIG. 18 illustrates an example in which the first regions 11, 31 result from first implanted regions 41, 51 that include dopant atoms of one of the first and second doping type only and the second regions 12, 32 result from second implanted regions 42, 52 that include dopant atoms of the other one of the first and second doping type only.

In each of the structures illustrated in FIGS. 17 and 18, each of the first regions 11, 31 in the inner region 110 and the edge region 120 and each of the second regions 12, 32 in the inner region 110 and the edge region has a horizontal dopant dose. The "horizontal dopant dose" is the integral of the respective doping concentration in the horizontal direction x. The dopant dose of these first and second regions 11, 12, 31, 32 is adjusted by suitably selecting the implantation doses when forming the first and second implanted regions 41, 42, 51, 52 (and, optionally, 61, 62) in the inner region 110 and the edge region. Referring to the above, in at least one of the semiconductor layers $140_1$-$140_n$, the first and second implanted regions 51, 52 (61, 62) in the edge region are produced to have a lower dopant dose than first and second implanted regions 41, 42 in the inner region. Consequently, at least one of the first and second regions 31, 32 in the edge region 120 at least locally (that is, at least at certain vertical positions) has a horizontal dopant dose that is lower than the horizontal dopant dose in the first and second regions 11, 21 in the inner region. That is, there is at least one layer of the plurality of semiconductor layers $140_1$-$140_n$ in which the horizontal dopant dose in the first and second regions 11, 12, 31, 32 decreases towards the edge surface 102. "To decrease" may include any kind of decreasing such as having a first dopant dose in the inner region 110 and a second horizontal dopant dose lower than the first horizontal in the edge region 120, or having several different dopant doses in the edge region 120 such that the horizontal dopant dose decreases towards the edge surface 102.

The optional buffer region 18 has a vertical dopant dose. The "vertical dopant dose" is the integral of the respective doping concentration in the vertical direction z. The dopant dose of the buffer region 18 can be adjusted by suitably selecting the implantation doses in one of the processes illustrated in FIGS. 13A to 13B and 14A to 14B. Using one of these processes, the buffer region 18 can be produced such that the vertical dopant dose decreases towards the edge surface 102. That is, there is at least one dopant dose in the inner region 110 and another dose in the edge region different from the dopant dose in the inner region 110. According to one example, a decrease of the vertical dopant dose in the buffer region 18 essentially equals a decrease of the horizontal dopant dose of the first and second regions 31, 32 in the at least one semiconductor layer $140_i$. According to one example, "a decrease of the vertical dopant dose in the buffer region essentially equals a decrease of the horizontal dopant dose of the first and second regions 11, 12, 31, 32" includes that a ratio between the horizontal dopant dose of a first region 31 (or a second region 32) at a first lateral position and the horizontal dopant dose of another first region 31 (or another second region 32) at a second lateral position different from the first lateral position and closer to the edge surface 102 than the first lateral position deviates less than 20% or even less than 10% from a ratio between the vertical dopant dose of the buffer region 18 at the first lateral position and the vertical dopant dose of the buffer region 18 at the second lateral position.

According to one example, the first doping type of the buffer region 18 is an n-type and the dopant atoms implanted into the epitaxial layer 131 in one of the implantation processes explained above are dopant atoms that diffuse faster than the dopant atoms that form the first regions 11, 31 in the inner region 110 and the edge region 120. According to one example, the dopant atoms in the buffer region 18 are phosphorous (P) atoms and the dopant atoms in the first regions 11, 31 are As and/or Sb atoms.

Based on a structure according to one of FIGS. 17 and 18, the transistor device is completed by forming the body regions 13 and the source regions 14 in the further semiconductor layer 170, by forming the gate electrode 15 and the gate dielectric 16, and by forming the source electrode 21. Methods for forming these device features are commonly known so that no further explanations are required in this regard.

Figure 19:
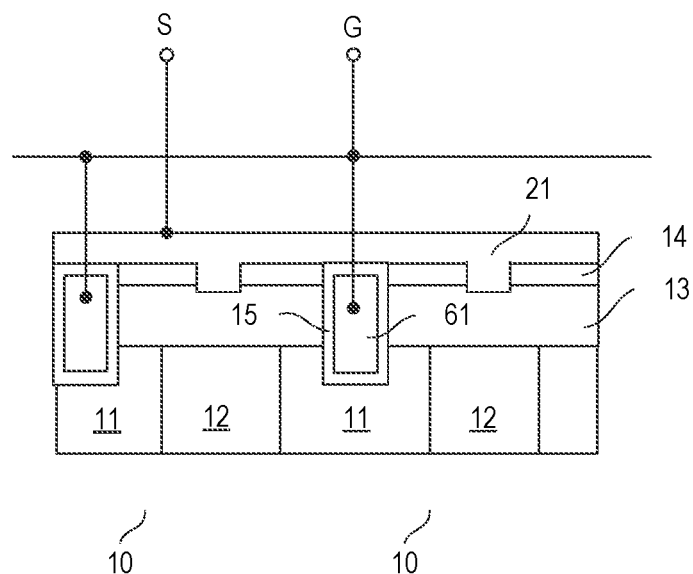
FIG. 19 illustrates vertical cross sectional views of sections of transistor cells having a trench gate electrode.

In the example illustrated in FIGS. 1A-1B and 13, the transistor cells include a planar gate electrode 14 arranged on top of the surface 101 of the semiconductor body 100. This, however, is only an example. According to another example illustrated in FIG. 19, the transistor cells 10 may be implemented with trench gate electrodes 15 as well. It should be noted that FIGS. 14A-B only illustrates those sections of several transistor cells 10 that include the gate electrodes 15.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A transistor device, comprising:
   a semiconductor body;
   a plurality of first regions of a first doping type and a plurality of second regions of a second doping type in an inner region and an edge region of the semiconductor body;
   a plurality of transistor cells in the inner region of the semiconductor body, each transistor cell comprising a body region and a source region, the transistor cells comprising a common drain region; and
   a buffer region arranged between the common drain region and the first and second regions,
   wherein a dopant dose in the first and second regions decreases towards an edge surface of the semiconductor body,
   wherein a dopant dose in the buffer region decreases towards the edge surface.

2. The transistor device of claim 1, wherein the dopant dose in the first and second regions decreases towards the edge surface that comprises at least one of the first and second regions in the edge region and at least locally has a lower dopant dose than the first and second regions in the inner region.

3. The transistor device of claim 1, wherein the buffer region has a first dopant dose in the inner region and at least one further dopant dose lower than the first dopant dose in the edge region.

4. The transistor device of claim 1, wherein the semiconductor body has a first surface and a second surface opposite the first surface, wherein the edge surface extends from the first surface to the second surface, wherein the edge region is arranged between the edge surface and the inner region, and wherein in a plane parallel to the first surface and the second surface, the edge region surrounds the inner region.

5. The transistor device of claim 1, wherein the first regions in the inner region are drift regions, and wherein the second regions in the inner region are compensation regions.

6. The transistor device of claim 5, wherein the body regions are arranged between the source regions and the drift regions so that the source regions are separated from the drift regions by the body regions.

7. The transistor device of claim 5, wherein the compensation regions adjoin the body regions.

8. The transistor device of claim 5, wherein the common drain region adjoins each of the drift regions and the compensation regions.

9. The transistor device of claim 5, further comprising the buffer region of the first doping type arranged between the common drain region and each of the drift regions and the compensation regions.

10. The transistor device of claim 5, wherein the drift regions of two neighboring transistor cells are formed by one contiguous semiconductor region of the first doping type, and wherein the compensation regions of two other transistor cells are formed by a contiguous semiconductor region of the second doping type.

11. Transistor device of claim 1, wherein in the inner region, each of the first regions and the second regions adjoins at least one body region.

12. The transistor device of claim 1, wherein an innermost one of the first regions and the second regions in the edge region adjoins a body region of a transistor cell.

13. The transistor device of claim 1, wherein the first regions and the second regions are arranged alternatingly in a first horizontal direction of the semiconductor body.

14. The transistor device of claim 13, wherein the first regions and the second regions are elongated in a second horizontal direction perpendicular to the first horizontal direction.

15. The transistor device of claim 1, wherein some of the first regions are entirely arranged in the edge region, and wherein others of the first regions have first sections in the inner region and second sections in the edge region.

16. The transistor device of claim 1, wherein some of the second regions are entirely arranged in the edge region, and wherein others of the second regions have first sections in the inner region and second sections in the edge region.

17. The transistor device of claim 1, wherein the first regions arranged in the edge region are more lowly doped than the first regions arranged in the inner region, and wherein the second regions arranged in the edge region are more lowly doped than the second regions arranged in the inner region.

* * * * *